(12) United States Patent
Chang et al.

(10) Patent No.: US 12,176,259 B2
(45) Date of Patent: Dec. 24, 2024

(54) SEMICONDUCTOR PACKAGE STRUCTURE

(71) Applicant: Advanced Semiconductor Engineering, Inc., Kaohsiung (TW)

(72) Inventors: Yung-Shun Chang, Kaohsiung (TW); Teck-Chong Lee, Kaohsiung (TW)

(73) Assignee: ADVANCED SEMICONDUCTOR ENGINEERING, INC., Kaohsiung (TW)

( * ) Notice: Subject to any disclaimer, the term of this patent is extended or adjusted under 35 U.S.C. 154(b) by 482 days.

(21) Appl. No.: 17/542,187

(22) Filed: Dec. 3, 2021

(65) Prior Publication Data

US 2023/0178444 A1 Jun. 8, 2023

(51) Int. Cl.
*H01L 23/31* (2006.01)

(52) U.S. Cl.
CPC ...... *H01L 23/3142* (2013.01); *H01L 23/3128* (2013.01)

(58) Field of Classification Search
CPC .................. H01L 23/3142; H01L 23/3128
See application file for complete search history.

(56) References Cited

U.S. PATENT DOCUMENTS

| | | | |
|---|---|---|---|
| 11,581,284 B2* | 2/2023 | Kang | H01L 23/49811 |
| 2021/0265251 A1* | 8/2021 | Mun | H01L 23/562 |

* cited by examiner

*Primary Examiner* — Nathan W Ha
(74) *Attorney, Agent, or Firm* — FOLEY & LARDNER LLP

(57) ABSTRACT

A semiconductor package structure includes a circuit pattern structure, an encapsulant and an anchoring structure. The encapsulant is disposed on the circuit pattern structure. The anchoring structure is disposed adjacent to an interface between the encapsulant and the circuit pattern structure, and is configured to reduce a difference between a variation of expansion of the encapsulant and a variation of expansion of the circuit pattern structure in an environment of temperature variation.

3 Claims, 24 Drawing Sheets

SEMICONDUCTOR PACKAGE STRUCTURE

BACKGROUND

1. Field of the Disclosure

The present disclosure relates to a semiconductor package structure and a manufacturing method, and to a semiconductor package structure including a circuit pattern structure and an encapsulant covering the circuit pattern structure, and a method for manufacturing the semiconductor package structure.

2. Description of the Related Art

A conventional semiconductor package structure may include a circuit pattern structure (or a substrate) and a protection structure (or an encapsulant) covering a top layer of the circuit pattern structure (or the substrate). A material and a coefficient of thermal expansion (CTE) of the protection structure (or the encapsulant) may be different from a material and a CTE of the top layer of the circuit pattern structure (or the substrate). Thus, the CTE mismatch between the protection structure (or the encapsulant) and the top layer of the circuit pattern structure (or the substrate) may cause a delamination between the protection structure (or the encapsulant) and the top layer of the circuit pattern structure (or the substrate) during a thermal process, which may adversely affect the reliability and performance of the semiconductor package structure.

SUMMARY

In some embodiments, a semiconductor package structure includes a circuit pattern structure, an encapsulant and an anchoring structure. The encapsulant is disposed on the circuit pattern structure. The anchoring structure is disposed adjacent to an interface between the encapsulant and the circuit pattern structure, and is configured to reduce a difference between a variation of expansion of the encapsulant and a variation of expansion of the circuit pattern structure in an environment of temperature variation.

In some embodiments, a semiconductor package structure includes a circuit pattern structure, an electronic component, a first encapsulant and a first pile structure. The circuit pattern structure includes a bonding area. The electronic component is disposed over the bonding area of the circuit pattern structure. The first encapsulant is disposed on the circuit pattern structure and encapsulates the electronic component. A first interface is between the first encapsulant and the circuit pattern structure. The first pile structure is located outside the bonding area, adjacent to the first interface, into the first encapsulant and into the circuit pattern structure.

In some embodiments, a semiconductor package structure includes a circuit pattern structure, an encapsulant and an interlocking structure. The encapsulant is disposed on the circuit pattern structure. The interlocking structure is disposed between the encapsulant and the circuit pattern structure, and is configured to reduce a delamination between the encapsulant and the circuit pattern structure in an environment of temperature variation.

BRIEF DESCRIPTION OF THE DRAWINGS

Aspects of some embodiments of the present disclosure are readily understood from the following detailed description when read with the accompanying figures. It is noted that various structures may not be drawn to scale, and dimensions of the various structures may be arbitrarily increased or reduced for clarity of discussion.

DETAILED DESCRIPTION

Figure 1:
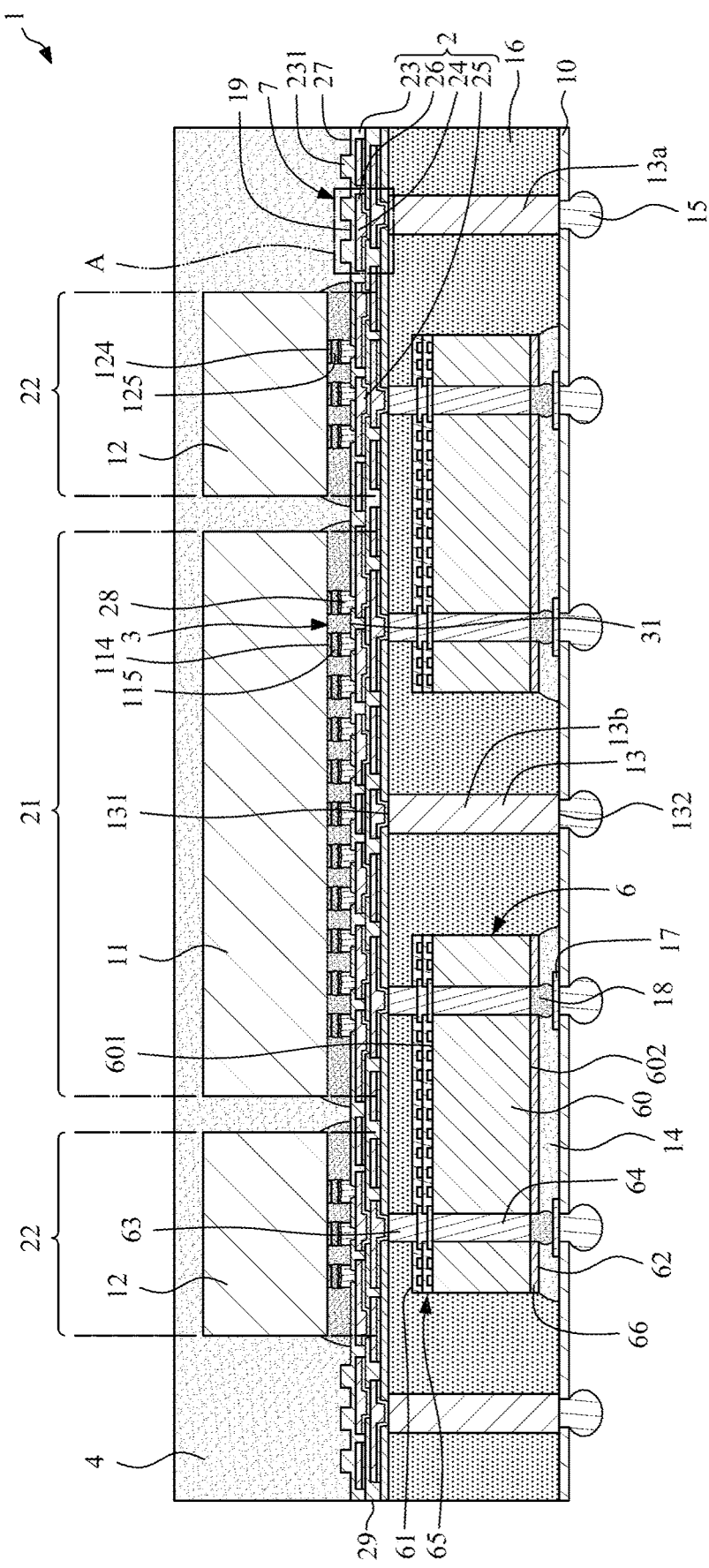
FIG. 1 illustrates a cross-sectional view of a semiconductor package structure according to some embodiments of the present disclosure.

Common reference numerals are used throughout the drawings and the detailed description to indicate the same or similar components. Embodiments of the present disclosure will be readily understood from the following detailed description taken in conjunction with the accompanying drawings.

The following disclosure provides many different embodiments, or examples, for implementing different features of the provided subject matter. Specific examples of components and arrangements are described below to explain certain aspects of the present disclosure. These are, of course, merely examples and are not intended to be limiting. For example, the formation of a first feature over or on a second feature in the description that follows may include embodiments in which the first and second features are formed or disposed in direct contact, and may also include embodiments in which additional features may be formed or disposed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Figure 1A:
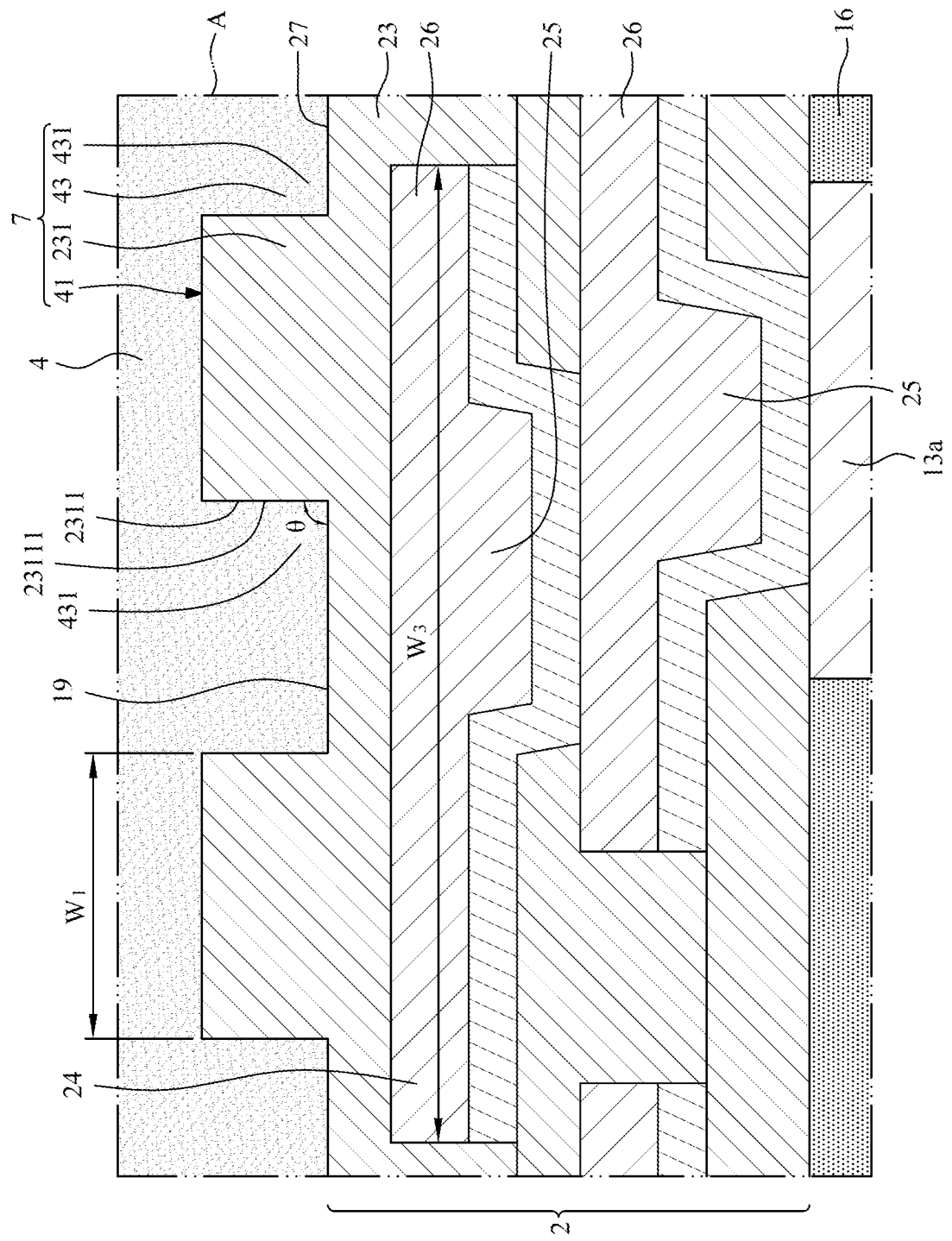
FIG. 1A illustrates an enlarged view of an area "A" of FIG. 1.
Figure 2:
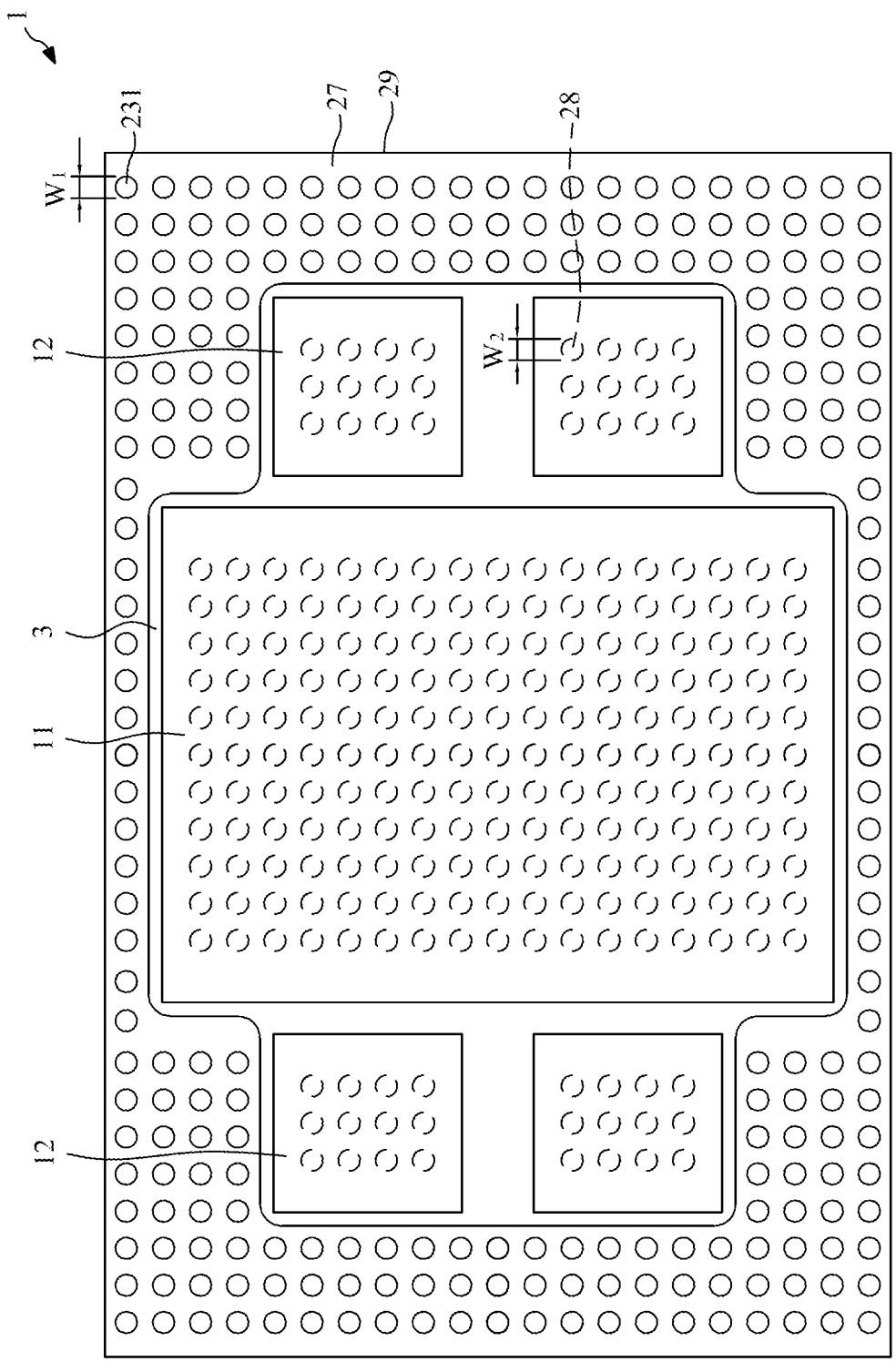
FIG. 2 illustrates a top view of the semiconductor package structure of FIG. 1 according to some embodiments of the present disclosure, wherein a first encapsulant is omitted for clear explanation.

FIG. 1 illustrates a cross-sectional view of a semiconductor package structure 1 according to some embodiments of the present disclosure. FIG. 1A illustrates an enlarged view of an area "A" of FIG. 1. FIG. 2 illustrates a top view of the semiconductor package structure 1 of FIG. 1 according to some embodiments of the present disclosure, wherein a first encapsulant 4 is omitted for clear explanation.

The semiconductor package structure 1 may include a base dielectric layer 10, at least one bridge die 6, a second encapsulant 16, at least one reinforcement pillar 13, a circuit pattern structure 2, at least one anchoring structure 231, at least one interlocking structure 43, one or more electronic components 11, 12, a first encapsulant 4, and a plurality of external connectors 15. The base dielectric layer 10 may be a single layer that is made of a cured photoimageable dielectric (PID) material such as epoxy or polyimide (PI) including photoinitiators. In some embodiments, at least one conductive pad 17 may be further disposed on a top surface of the base dielectric layer 10. In some embodiments, the base dielectric layer 10 may define a plurality of openings extending through the base dielectric layer 10 to expose the conductive pads 17 and the reinforcement pillars 13. The external connectors 15 (e.g., solder material) may be formed or disposed in the openings of the base dielectric layer 10 to contact the conductive pads 17 and the reinforcement pillars 13.

The bridge die 6 may be used for transmitting signals between the electronic components 11, 12. The bridge die 6 may have a first surface 61 (top surface) and a second surface 62 (bottom surface) opposite to the first surface 61. The first surface 61 of the bridge die 6 may be an active surface, and the second surface 62 of the bridge die 6 may be a backside surface. In some embodiments, the bridge die 6 may include a main body 60, at least one through via 64, a circuit structure 65, an insulation layer 66 and at least one short pillar 63. The main body 60 has a first surface 601 and a second surface 602 opposite to the first surface 601. A material of the main body 60 may be silicon or glass.

The through via 64 may extend through the main body 60 from the first surface 601 to the second surface 602. The top surface of the through via 64 may be substantially coplanar with the first surface 601 of the main body 60. The bottom surface of the through via 64 may be substantially coplanar with the second surface 602 of the main body 60. In other words, the end surfaces of the through via 64 may be exposed from the first surface 601 and the second surface 602 of the main body 60 respectively. In some embodiments, the through via 64 may include a conductive portion and an insulation layer surrounding the conductive portion. In some embodiments, the insulation layer may be omitted.

The circuit structure 65 may be disposed on the first surface 601 of the main body 60. The circuit structure 65 may be a back end of line (BEOL). In some embodiments, the circuit structure 65 may include at least one conductive layer (or circuit layer) and at least one passivation layer (or dielectric layer) disposed thereon. Portions of the conductive layer of the circuit structure 65 may contact and electrically connect the through via 64. In some embodiments, the circuit structure 65 may include a plurality of conductive layers and a plurality of passivation layers. In some embodiments, the bridge die 6 may further include a plurality of short pillars 63 disposed on the circuit structure 65. The short pillars 63 may be configured to electrically connect the conductive layer of the circuit structure 65.

The insulation layer 66 may be disposed on the second surface 602 of the main body 60, and may define an opening to expose the bottom surface of the through via 64. The insulation layer 66 may be made of a cured photoimageable dielectric (PID) material such as epoxy or polyimide (PI) including photoinitiators. In addition, a solder material 18 may be disposed in the opening of the insulation layer 66 to contact the exposed bottom surface of the through via 64.

As shown in FIG. 1, the solder material 18 contacts the conductive pad 17. Thus, the through via 64 of the bridge die 6 is electrically connected to the conductive pad 17 through the solder material 18. In some embodiments, an underfill 14 may be disposed in a space between the bridge die 6 and the base dielectric layer 10 to cover and protect the solder material 18 and the conductive pad 17.

The reinforcement pillar 13 may be a conductive element that extends through the second encapsulant 16, and may be disposed adjacent to the bridge die 6. The reinforcement pillars 13 may surround the bridge die 6. The reinforcement pillar 13 has a first surface 131 and a second surface 132 opposite to the first surface 131. In some embodiments, the first surface 131 of the reinforcement pillar 13 may be substantially coplanar with or aligned with the top surface of the short pillar 63, and the second surface 132 of the reinforcement pillar 13 may be disposed on and may contact the base dielectric layer 10. In some embodiments, the reinforcement pillar 13 may include a plurality of first reinforcement pillars 13a and a plurality of second reinforcement pillars 13b. The first reinforcement pillars 13a may be below the base portion 26 of the circuit pattern structure 2 and connected to the base portion 26. In some embodiments, the first reinforcement pillars 13a may be disposed adjacent to the periphery or the corner of the semiconductor package structure 1, and may be dummy. That is, the first reinforcement pillars 13a may have no electrical function. However, in some embodiments, the first reinforcement pillars 13a may have electrical function. In addition, the second reinforcement pillars 13b may be surrounded by the first reinforcement pillars 13a or the bridge dice 6. The second reinforcement pillars 13b may have electrical function, and may be used for transmitting signals. Alternatively, the second reinforcement pillars 13b may be grounded or may be used to receive power.

The second encapsulant 16 surrounds or encapsulates the bridge dice 6 and the reinforcement pillars 13. A material of the second encapsulant 16 may be a molding compound with or without fillers. The second encapsulant 16 has a first surface (e.g., a top surface) and a second surface (e.g., a bottom surface) opposite to the first surface. The second surface (e.g., the bottom surface) of the second encapsulant 16 may contact the base dielectric layer 10. The first surface (e.g., the top surface) of the second encapsulant 16 may be substantially coplanar with or aligned with the first surface 131 of the reinforcement pillar 13 and the top surfaces of the short pillars 63.

The circuit pattern structure 2 may be a redistribution structure or a wiring structure, and may be disposed on the top surface of the second encapsulant 16. Thus, the second encapsulant 16 may be disposed under the circuit pattern structure 2. The circuit pattern structure 2 may include at least one dielectric layer 23, at least one circuit layer 24 (or a redistribution layer), at least one inner via 25, and a plurality of conductive pads 28. As shown in FIG. 1, the circuit pattern structure 2 may include three dielectric layers 23, two circuit layers 24 and a plurality of inner vias 25. However, the amount of the dielectric layers 23 and the amount of the circuit layers 24 are not limited in the present disclosure. The dielectric layer 23 may be made of a cured photoimageable dielectric (PID) material such as epoxy or polyimide (PI) including photoinitiators. The dielectric layers 23 may cover the circuit layers 24, and may be stacked on one another. The inner vias 25 may connect the circuit layers 24.

The circuit layer 24 may include a seed layer and a conductive layer disposed thereon. In some embodiments, the seed layer may be omitted. Each of the circuit layers 24 may include at least one base portion 26. Thus, the circuit pattern structure 2 may include at least one base portion 26 therein. The location of the base portion 26 may correspond to the location of the first reinforcement pillars 13a. In some embodiments, the base portion 26 may be dummy. That is, the base portion 26 may have no electrical function. However, in some embodiments, the base portion 26 may have electrical function, and may be used for transmitting signals. Alternatively, the base portion 26 may be grounded or may be used to receive power. As shown in FIG. 1, the circuit pattern structure 2 may include a plurality of the base portions 26 connected with one another through the inner via 25, and a width of the inner via 25 is less than a width of the base portion 26 from the cross-sectional view. The base portion 26 may be connected to the first reinforcement pillar 13a through the inner via 25. The circuit layer 24 may be electrically connected to the short pillar 63 through the inner via 25. The inner via 25 may taper toward the bridge die 6 and/or the reinforcement pillars 13.

The conductive pad 28 may protrude from a top surface 27 of the circuit pattern structure 2, and may extend through the topmost dielectric layer 23 and electrically connected to the topmost circuit layer 24. In some embodiments, the circuit pattern structure 2 may include one or more bonding areas 21, 22. The bonding areas 21, 22 may be die bond areas.

The electronic components 11, 12 are disposed adjacent to the top surface 27 of the circuit pattern structure 2 side by side, and are electrically connected to the circuit layer 24 of the circuit pattern structure 2. The electronic components 11, 12 may be disposed above or disposed over the bonding areas 21, 22 of the circuit pattern structure 2. The electronic component 11 may be a semiconductor device such as an application specific integrated circuit (ASIC) die. The electronic component 11 may have a bottom surface (e.g., a first active surface), a top surface (e.g., a first backside surface) opposite to the bottom surface, and a lateral surface extending between the top surface and the bottom surface. Further, the electronic component 11 may include a plurality of first electrical contacts 114 disposed adjacent to the bottom surface (e.g., the first active surface). The first electrical contacts 114 may be exposed or may protrude from the bottom surface (e.g., the first active surface) for electrical connection. The first electrical contacts 114 may be pads, bumps, studs, pillars or posts. In some embodiments, the first electrical contacts 114 of the electronic component 11 may be electrically connected and physically connected to the conductive pads 28 through a plurality of solder materials 115. In other words, the electronic component 11 may be electrically connected to the circuit pattern structure 2 by flip-chip bonding.

The electronic component 12 may be a semiconductor device such as a high bandwidth memory (HBM) die. The electronic component 12 may have a bottom surface (e.g., a second active surface), a top surface (e.g., a second backside surface) opposite to the bottom surface, and a lateral surface extending between the top surface and the bottom surface. Further, the electronic component 12 may include a plurality of second electrical contacts 124 disposed adjacent to the bottom surface (e.g., the second active surface). The second electrical contacts 124 may be exposed or may protrude from the bottom surface (e.g., the second active surface) for electrical connection. The second electrical contacts 124 may be pads, bumps, studs, pillars or posts. In some embodiments, the second electrical contacts 124 of the electronic component 12 may be electrically connected and physically connected to the conductive pads 28 through a plurality of solder materials 125. In other words, the electronic component 12 may be electrically connected to the circuit pattern structure 2 by flip-chip bonding.

As shown in FIG. 1, an underfill 3 may be further included, and may be disposed in the space between the electronic components 11, 12 and the circuit pattern structure 2 so as to cover and protect the joints formed by the first electrical contacts 114, the conductive pads 28 and the solder materials 115, and the joints formed by the second electrical contacts 124, the conductive pads 28 and the solder materials 125. Thus, the underfill 3 may be disposed on the circuit pattern structure 2 and may extend between the electronic components 11, 12 and the circuit pattern structure 2. A second interface 31 (or a boundary) is formed between the underfill 3 and the top surface 27 of the circuit pattern structure 2. In some embodiments, the underfill 3 may be omitted.

The first encapsulant 4 (e.g., an upper encapsulant) may be disposed on the circuit pattern structure 2 and may encapsulate the electronic components 11, 12 and the underfill 3. A material of the first encapsulant 4 may be a molding compound with or without fillers. If the underfill 3 is omitted, the first encapsulant 4 may be disposed in the space between the electronic components 11, 12 and the circuit pattern structure 2 so as to cover and protect the joints formed by the first electrical contacts 114, the conductive pads 28 and the solder materials 115, and the joints formed by the second electrical contacts 124, the conductive pads 28 and the solder materials 125. Further, a first interface 19 (or a boundary) is formed between the first encapsulant 4 and the top surface 27 of the circuit pattern structure 2. In some embodiments, the topmost dielectric layer 23 of the circuit pattern structure 2 may include a first material, the first encapsulant 4 may include a second material, and a CTE of the first material is greater than a CTE of the second material.

As shown in FIG. 1A, the anchoring structure 231 and the interlocking structure 43 may be disposed adjacent to the first encapsulant 4 and the circuit pattern structure 2. For example, the anchoring structure 231 and the interlocking structure 43 may be disposed in the first encapsulant 4 and the circuit pattern structure 2. In some embodiments, the anchoring structure 231 and the interlocking structure 43 may form an engagement structure 7 (or an interlocking structure). The anchoring structure 231 may be a resist structure. The anchoring structure 231 may be a protrusion protruding from the top surface 27 of the circuit pattern structure 2. For example, the anchoring structure 231 may be a portion of the topmost dielectric layer 23 of the circuit pattern structure 2, and may extend into the first encapsulant 4 from the circuit pattern structure 2. The anchoring structure 231 may have a resist surface 2311 protruding from the first interface 19, and the resist surface 2311 is nonparallel with the first interface 19 from a cross-sectional view. An angle θ between the resist surface 2311 and the interface 19 is a non-obtuse angle from the cross-sectional view. Further, the resist surface 2311 may include an inner surface 23111 facing a region adjacent to a center of the circuit pattern structure 2. The inner surface 23111 of the resist surface 2311 may be substantially perpendicular with the interface 19 from the cross-sectional view.

The interlocking structure 43 may be a clamping structure and may include a clamping portion 431 around and contacting the protrusion (i.e., the anchoring structure 231) protruding from the top surface 27 of the circuit pattern structure 2. For example, the interlocking structure 43 may be a portion of the first encapsulant 4, and may define a recess 41 for accommodating the protrusion (i.e., the anchoring structure 231) so as to form the engagement structure 7.

As shown in FIG. 2, the anchoring structure 231 may surround or may be disposed around the electronic components 11, 12. A width $W_1$ of the anchoring structure 231 may be less than, equal to or greater than a width $W_2$ of the conductive pad 28. As shown in FIG. 1A, the width $W_1$ of the anchoring structure 231 may be less than a width $W_3$ of the base portion 26.

In the embodiment illustrated in FIGS. 1, 1A, 2, the engagement structure 7 (including the anchoring structure 231 and the interlocking structure 43) may be configured to reduce a difference between a variation of expansion of the first encapsulant 4 and a variation of expansion of the circuit pattern structure 2 in an environment of temperature variation, such as during a thermal process. For example, the engagement structure 7 (including the anchoring structure 231 and the interlocking structure 43) may be configured to reduce the difference between the variation of expansion of the first encapsulant 4 along a direction nonperpendicular (or parallel) to the first interface 19 and the variation of expansion of the circuit pattern structure 2 along the direction nonperpendicular (or parallel) to the first interface 19 when the environment temperature changes or varies. Thus, when the semiconductor package structure 1 is heated or cooled, the engagement structure 7 (including the anchoring structure 231 and the interlocking structure 43) may be configured to prevent a relative movement between the circuit pattern structure 2 and the first encapsulant 4, so as to reduce a delamination between the first encapsulant 4 and the circuit pattern structure 2 caused by the difference between the variation of expansion of the first encapsulant 4 and the variation of expansion of the circuit pattern structure 2 due to CTE (coefficient of thermal expansion) mismatch between the encapsulant 4 and the circuit pattern structure 2 in the environment of temperature variation. As a result, the reliability and performance of the semiconductor package structure 1 is improved.

Figure 3:
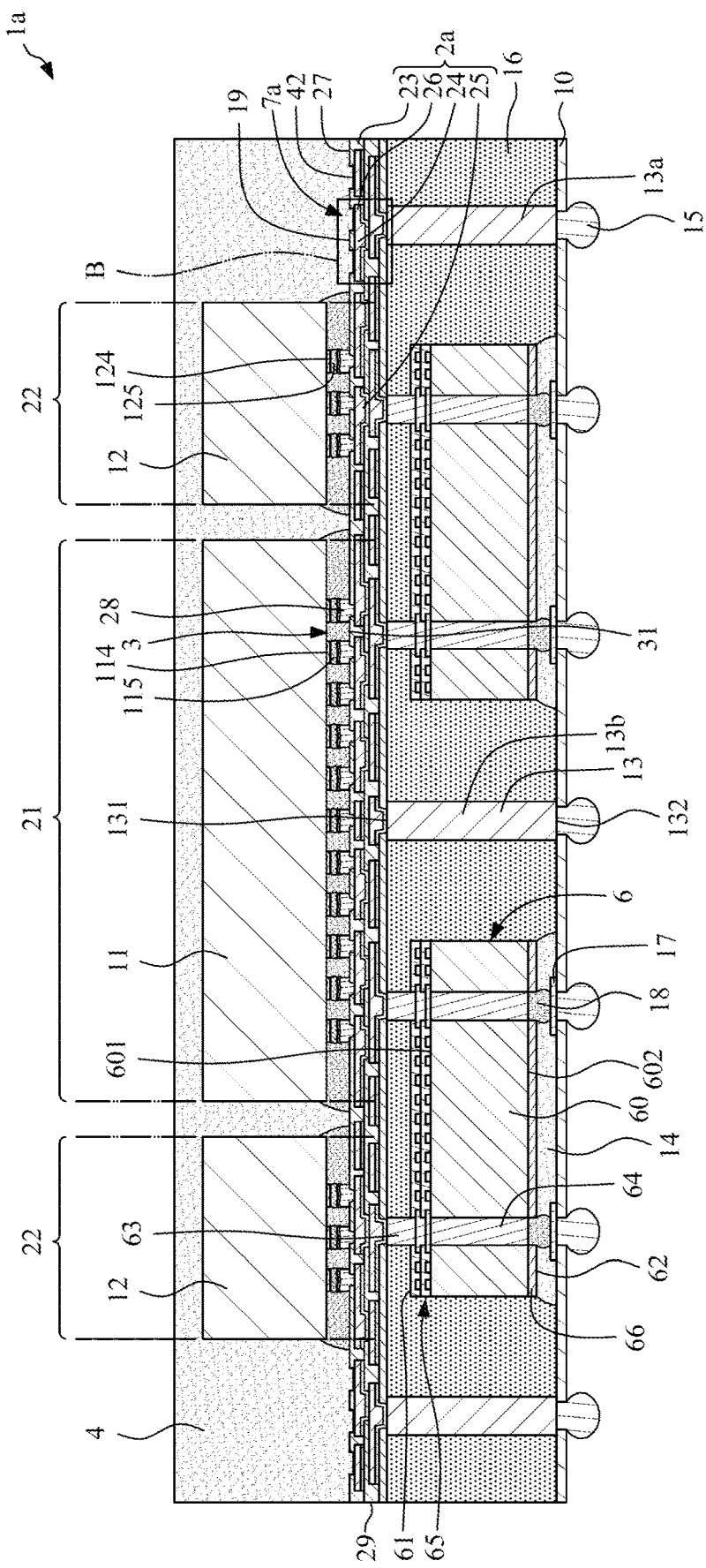
FIG. 3 illustrates a cross-sectional view of a semiconductor package structure according to some embodiments of the present disclosure.
Figure 3A:
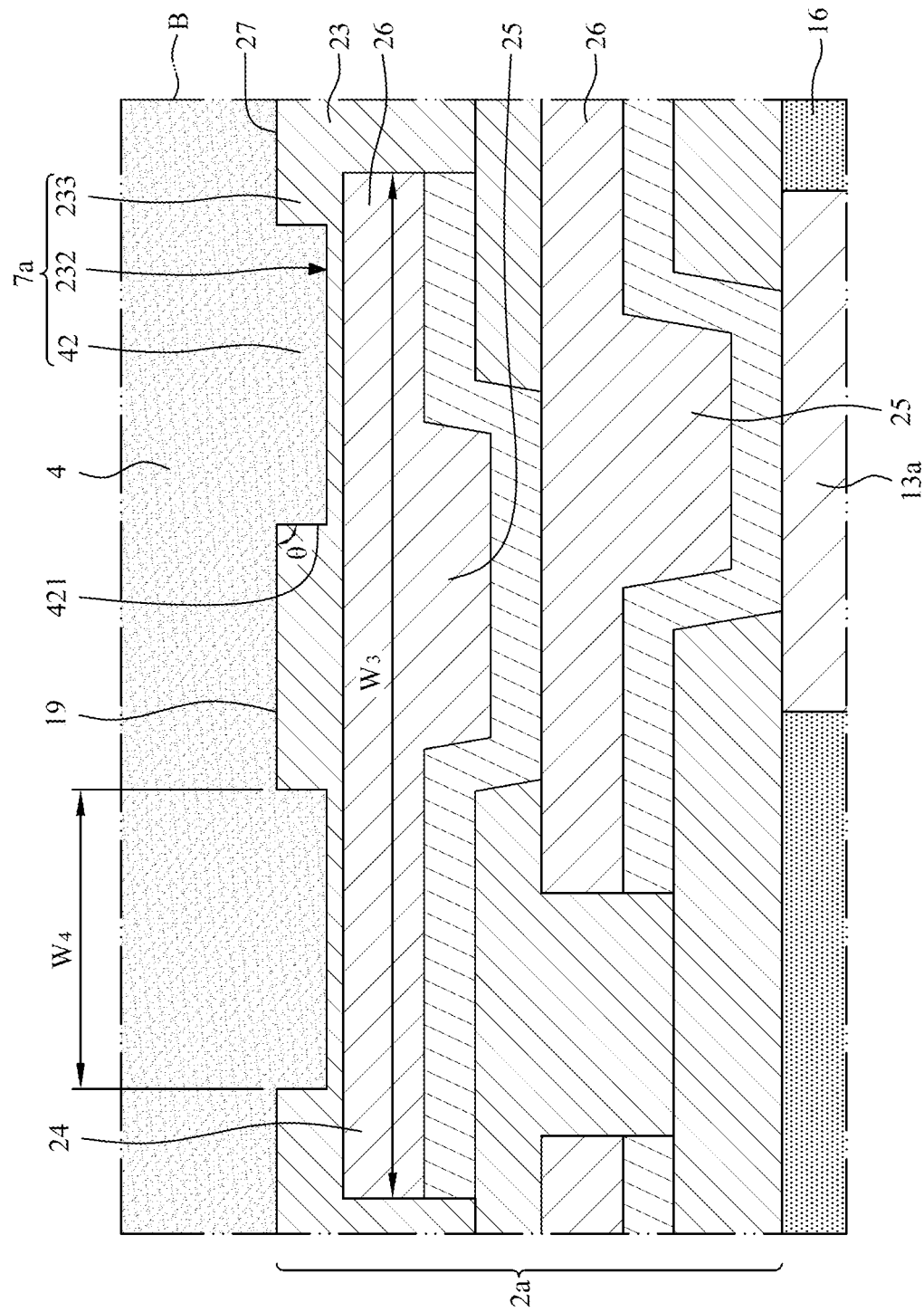
FIG. 3A illustrates an enlarged view of an area "B" of FIG. 3.

FIG. 3 illustrates a cross-sectional view of a semiconductor package structure 1a according to some embodiments of the present disclosure. FIG. 3A illustrates an enlarged view of an area "B" of FIG. 3. The semiconductor package structure 1a of FIG. 3 is similar to the semiconductor package structure 1 of FIGS. 1 and 1A, except for the structures of the circuit pattern structure 2a and the engagement structure 7a.

The engagement structure 7a of FIG. 3 may include the anchoring structure 42 and the interlocking structure 233, and may be disposed in the first encapsulant 4 and the circuit pattern structure 2a. The anchoring structure 42 may be a protrusion protruding from the bottom surface of the first encapsulant 4. For example, the anchoring structure 42 may be a portion of the first encapsulant 4, and may extend into the circuit pattern structure 2a from the first encapsulant 4. The anchoring structure 42 may have a resist surface 421 protruding from the first interface 19, and the resist surface 421 is nonparallel with the first interface 19 from a cross-sectional view. An angle θ between the resist surface 421 and the interface 19 is a non-obtuse angle from the cross-sectional view.

The interlocking structure 233 may surround and contact the protrusion (i.e., the anchoring structure 42) protruding from the bottom surface of the first encapsulant 4. For example, the interlocking structure 233 may be a portion of the topmost dielectric layer 23 of the circuit pattern structure 2a, and may define a recess 232 for accommodating the protrusion (i.e., the anchoring structure 42) so as to form the engagement structure 7a. As shown in FIG. 3A, the width $W_4$ of the anchoring structure 42 may be less than the width $W_3$ of the base portion 26.

In the embodiment illustrated in FIGS. 3, 3A, the engagement structure 7a (including the anchoring structure 42 and the interlocking structure 233) may be configured to reduce a difference between a variation of expansion of the first encapsulant 4 and a variation of expansion of the circuit pattern structure 2a in an environment of temperature variation, such as during a thermal process.

Figure 4:
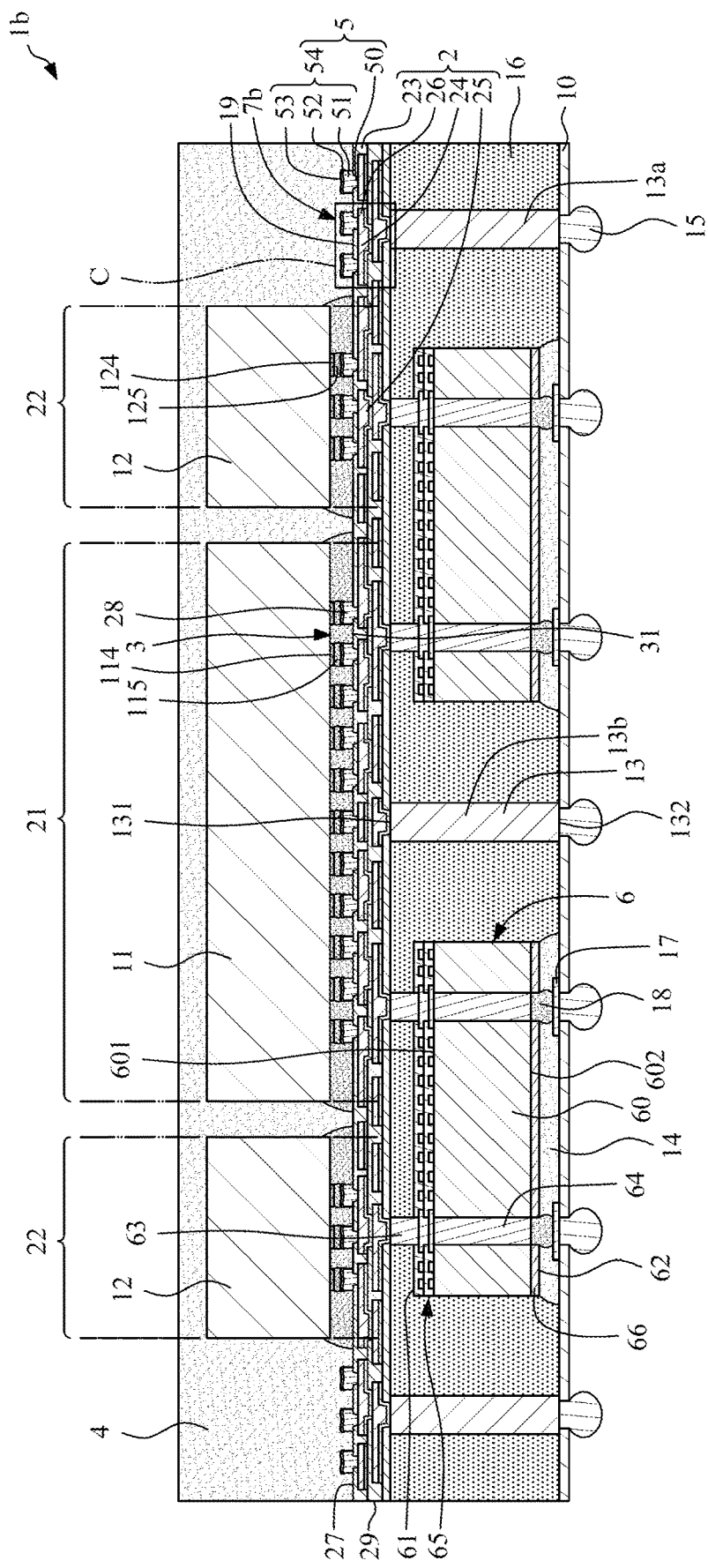
FIG. 4 illustrates a cross-sectional view of a semiconductor package structure according to some embodiments of the present disclosure.
Figure 4A:
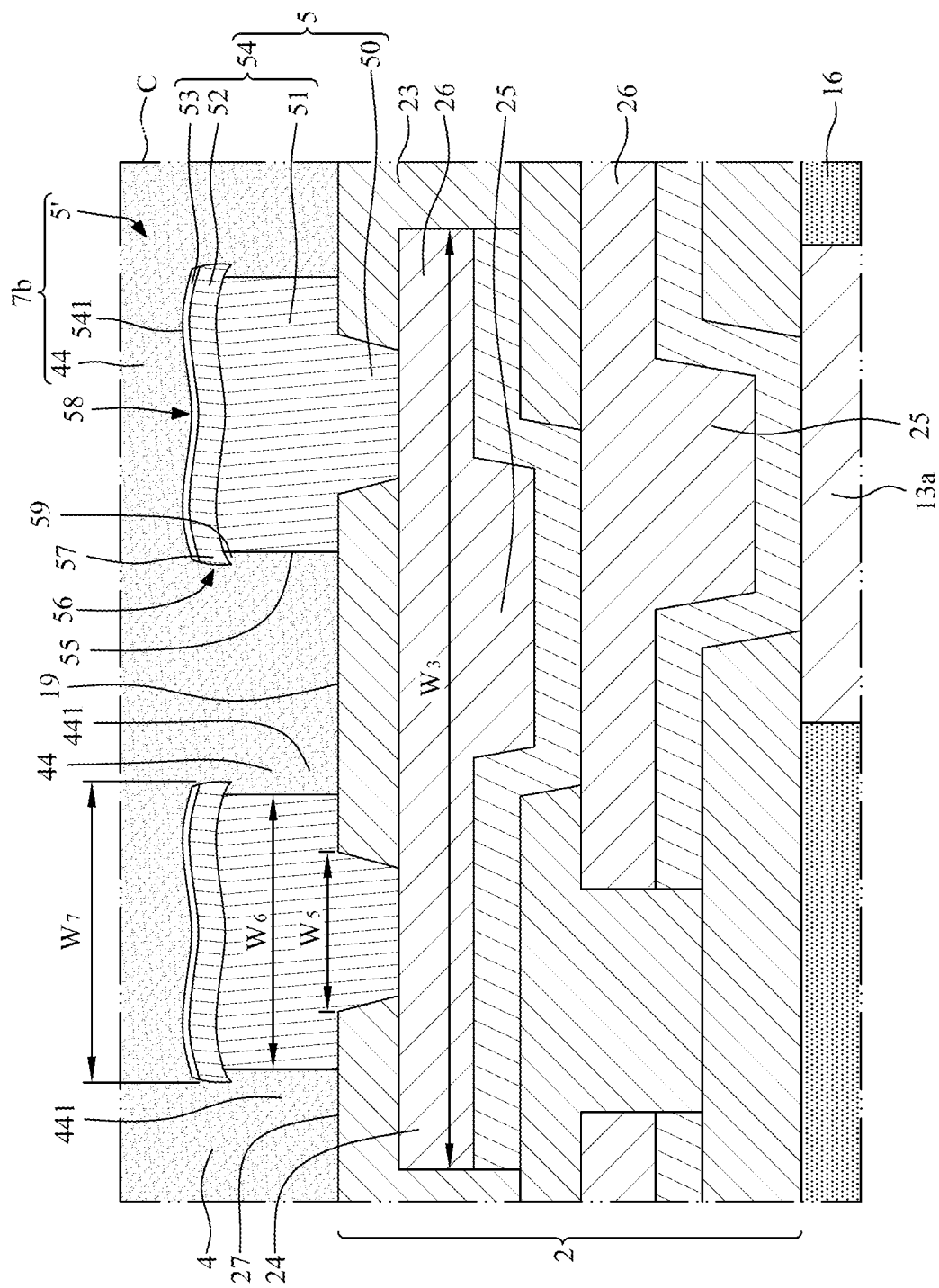
FIG. 4A illustrates an enlarged view of an area "C" of FIG. 4.

FIG. 4 illustrates a cross-sectional view of a semiconductor package structure 1b according to some embodiments of the present disclosure. FIG. 4A illustrates an enlarged view of an area "C" of FIG. 4. The semiconductor package structure 1b of FIG. 4 is similar to the semiconductor package structure 1 of FIGS. 1 and 1A, except for a structure of the engagement structure 7b.

The engagement structure 7b of FIG. 4 may include the anchoring structure 5' and the interlocking structure 44, and may be disposed in the first encapsulant 4 and the circuit pattern structure 2. The anchoring structure 5' may include at least one first pile structure 5. The first pile structure 5 may be located outside the bonding areas 21, 22, adjacent to the first interface 19, into the first encapsulant 4 and into the circuit pattern structure 2. The first pile structure 5 may be closer to an edge 29 (or a periphery) of the circuit pattern structure 2 than the bonding area 21, 22 is. Thus, the first pile structure 5 may be disposed between the periphery of the circuit pattern structure 2 and the bonding area 21, 22 is. In some embodiments, the first pile structure 5 may be located adjacent to a corner of the circuit pattern structure 2.

The first pile structure 5 may be an anchoring structure, and may include a protrusion 54 and a via portion 50. The protrusion 54 may protrude beyond the top surface 27 of the circuit pattern structure 2. The via portion 50 may be disposed in the topmost dielectric layer 23 of the circuit pattern structure 2. The via portion 50 connects the protrusion 54 and the base portion 26. The protrusion 54 may include a first portion 51, a second portion 52 and a third portion 53. The first portion 51 of the protrusion 54 and the via portion 50 may be formed concurrently and integrally as a monolithic structure, and may include a first metal such as copper. The second portion 52 may be disposed on the first portion 51, and may include a second metal such as nickel. The first portion 51 is closer to the circuit pattern structure 2 than the second portion 52 is. The third portion 53 may be disposed on the second portion 52, and may include a third metal such as SnAg alloy. Thus, a thermal conductivity of a material of the first pile structure 5 (or the anchoring structure 5') is greater than a thermal conductivity of a material of the encapsulant 4 and a thermal conductivity of the circuit pattern structure 2.

A width $W_5$ of the via portion 50 is less than the width $W_3$ of the base portion 26. A width $W_6$ of the first portion 51 is greater than the width $W_5$ of the via portion 50, and is less than the width $W_3$ of the base portion 26. Thus, the width $W_5$ of the via portion 50 is less than the width $W_6$ of the first portion 51 of the protrusion 54. A width $W_7$ of the second portion 52 is greater than the width $W_6$ of the first portion 51, and is less than the width $W_3$ of the base portion 26. Thus, the width $W_5$ of the via portion 50 is less than the width $W_7$ of the second portion 52 of the protrusion 54. Further, the width $W_3$ of the base portion 26 is greater than the width $W_7$ of the second portion 52 of the first pile structure 5. In addition, the width $W_5$ of the via portion 50 may decrease toward the base portion 26.

In some embodiments, the first pile structure 5 may be a dummy. That is, the first pile structure 5 may have no electrical function, and may not be used for transmitting signals. In addition, the size and structure of the conductive pad 28 may be similar to or same as the size and structure of the first pile structure 5, and they may be formed concurrently. For example, the conductive pad 28 may include a protrusion similar to or same as the protrusion 54 and a via portion similar to or same as the via portion 50. The protrusion of the conductive pad 28 may include a first portion similar to or same as the first portion 51, a second portion similar to or same as the second portion 52 and a third portion similar to or same as the third portion 53.

The interlocking structure 44 may be a portion of the first encapsulant 4, and may include a clamping portion 441 surrounding and covering the protrusion 54 protruding from the top surface 27 of the circuit pattern structure 2. The clamping portion 441 may contact the first portion 51, the second portion 52 and the third portion 53. In addition, the clamping portion 441 contacts a step structure 56 on a lateral surface 55 of the protrusion 54. The step structure 56 may be formed due to the difference between the width $W_7$ of the second portion 52 and the width $W_6$ of the first portion 51 after an etching process. As shown in FIG. 4A, the lateral surface 55 of the protrusion 54 may define a slot portion 59 recessed toward a top surface 541 of the protrusion 54. Thus, the step structure 56 may include a hook 57. A bottom surface of the hook 57 is an extension of the interface between the second portion 52 and the first portion 51. In addition, a top surface 541 of the protrusion 54 may define a recess 58, and the interlocking structure 44 may extend into the recess 58.

In the embodiment illustrated in FIGS. 4, 4A, the engagement structure 7b (including the first pile structure 5 (or the anchoring structure 5') and the interlocking structure 44) may be configured to reduce a difference between a variation of expansion of the first encapsulant 4 and a variation of expansion of the circuit pattern structure 2a in an environment of temperature variation, such as during a thermal process. In addition, the first pile structure 5 is physically connected to the first reinforcement pillar 13a through the base portion (a) 26 and the inner via(s) 25 so as to form a stress release path. That is, the stress near the first pile structure 5 may be release downward to the first reinforcement pillar 13a through the base portion (a) 26 and the inner via(s) 25. Thus, the stress near the periphery of the semiconductor package structure 1b is reduced, so as to reduce a delamination between the first encapsulant 4 and the circuit pattern structure 2 caused by the CTE mismatch between the encapsulant 4 and the circuit pattern structure 2 in the environment of temperature variation. As a result, the reliability and performance of the semiconductor package structure 1b is further improved.

Figure 4B:
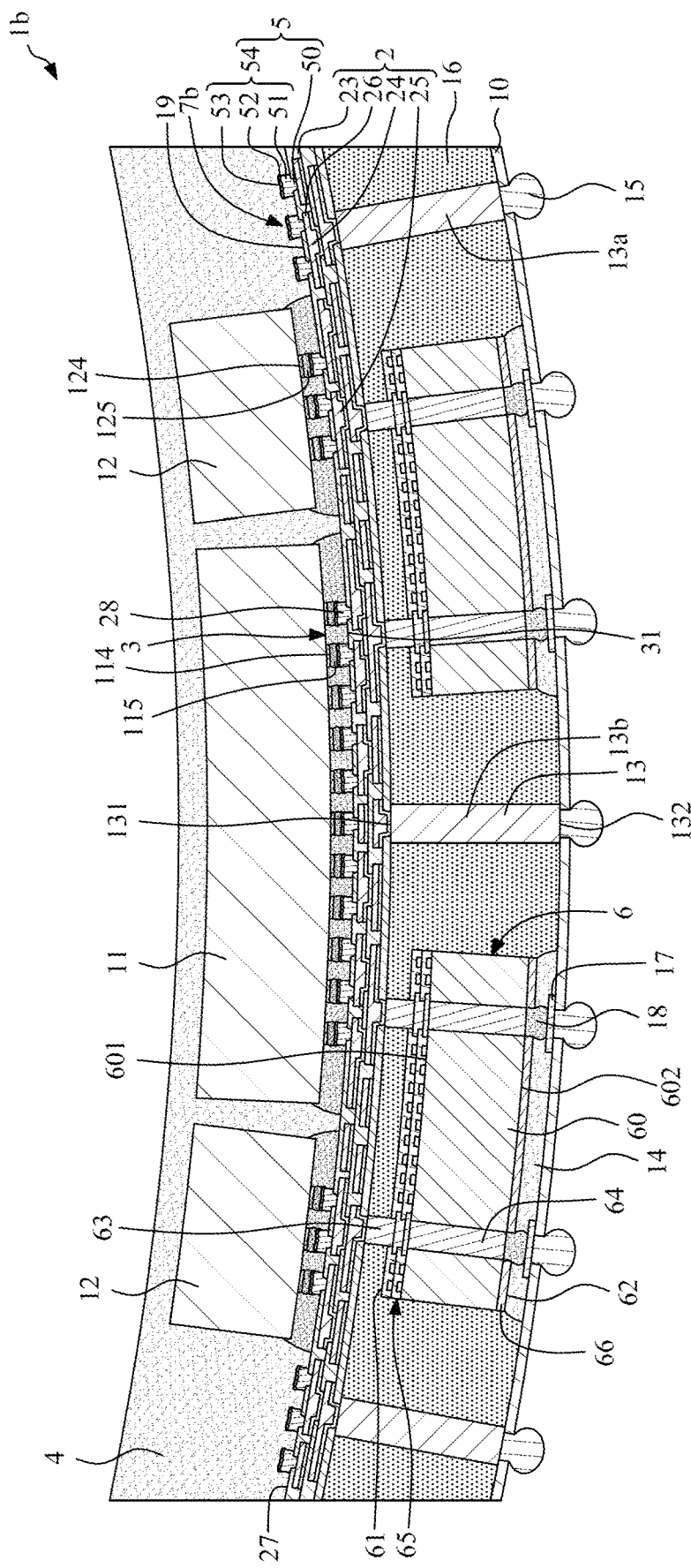
FIG. 4B illustrates a cross-sectional view of the semiconductor package structure of FIG. 4 with a warpage according to some embodiments of the present disclosure.

FIG. 4B illustrates a cross-sectional view of the semiconductor package structure 1b of FIG. 4 with a warpage according to some embodiments of the present disclosure. As shown in FIG. 4B, if the semiconductor package structure 1b of FIG. 4 warps (i.e., the semiconductor package structure 1b has a warpage) due to the CTE mismatch between the encapsulant 4 and the circuit pattern structure 2, a delamination between the first encapsulant 4 and the circuit pattern structure 2 may not occur.

Figure 5:
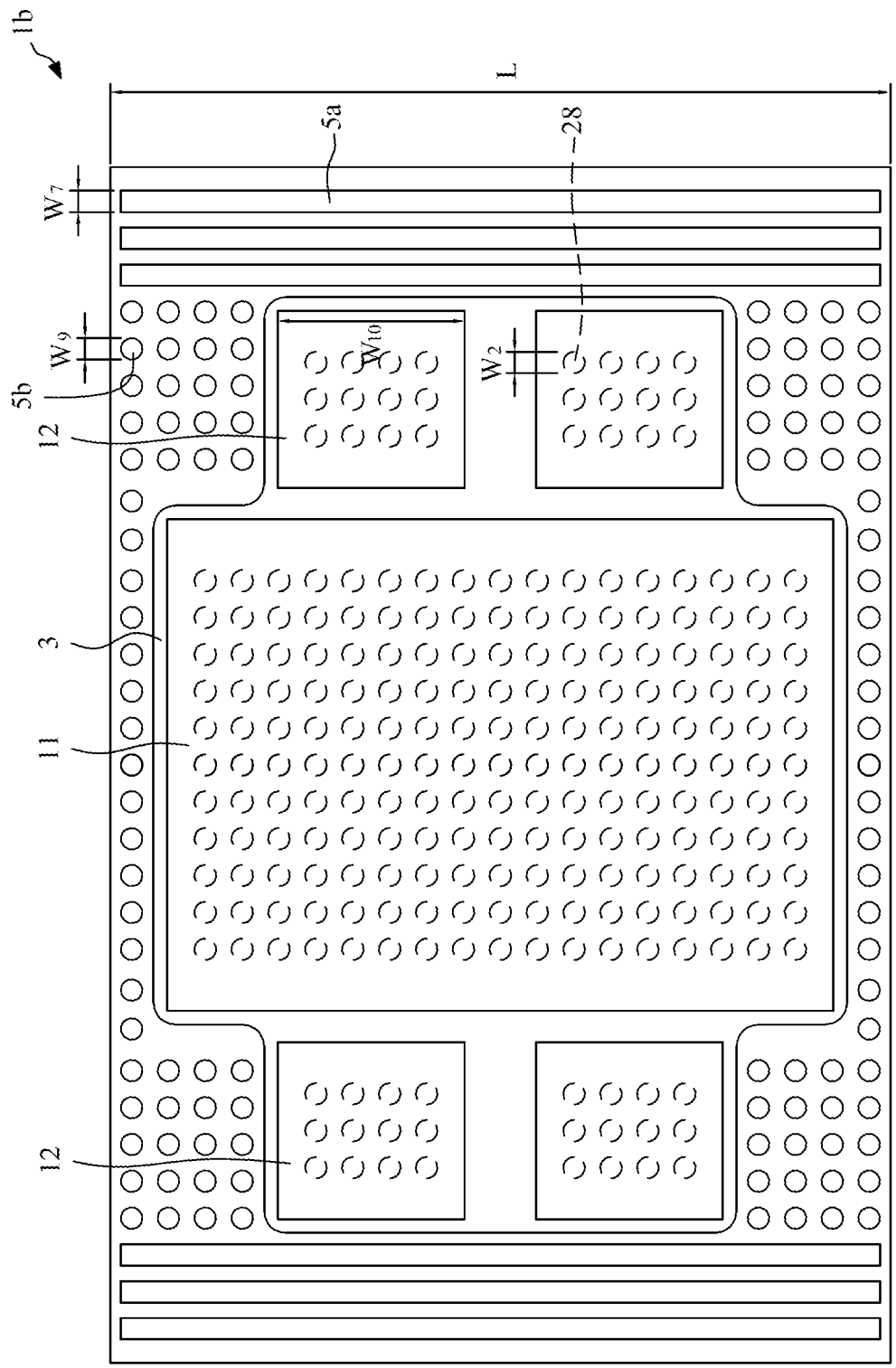
FIG. 5 illustrates a top view of the semiconductor package structure of FIG. 4 according to some embodiments of the present disclosure, wherein a first encapsulant is omitted for clear explanation.

FIG. 5 illustrates a top view of the semiconductor package structure 1b of FIG. 4 according to some embodiments of the present disclosure, wherein a first encapsulant 4 is omitted for clear explanation. In some embodiments, the first pile structures 5 (or the anchoring structures 5') of the semiconductor package structure 1b of FIG. 4 may be arranged in a manner or pattern similar to or same as the arrangement of the anchoring structures 231 as shown in FIG. 2. In some embodiments, the first pile structures 5 (or the anchoring structures 5') of the semiconductor package structure 1b of FIG. 4 may be arranged as shown in FIG. 5. In FIG. 5, the first pile structures 5 (or the anchoring structures 5') may include a plurality of first segments 5a and a plurality of pin structures 5b. A length L (or a width) of the first segment 5a of the first pile structure 5 is greater than a width $W_2$ of the conductive pad 28. The length L (or the width) of the first segment 5a of the first pile structure 5 may be greater than a width Wio (or a length) of the electronic component 12 and a width (or a length) of the electronic component 11. As shown in FIG. 5, a width $W_9$ of the pin structure 5b of the first pile structures 5 (or the anchoring structures 5') may be less than, equal to or greater than the width $W_2$ of the conductive pad 28. The width $W_9$ of the pin structure 5b of the first pile structures 5 (or the anchoring structures 5') may be equal to the width $W_7$ (FIG. 4A) of the second portion 52 of the first pile structure 5. As shown in FIG. 5, the first pile structures 5 (including the first segments 5a and the pin structures 5b) are disposed around the electronic components 11, 12.

Figure 6:
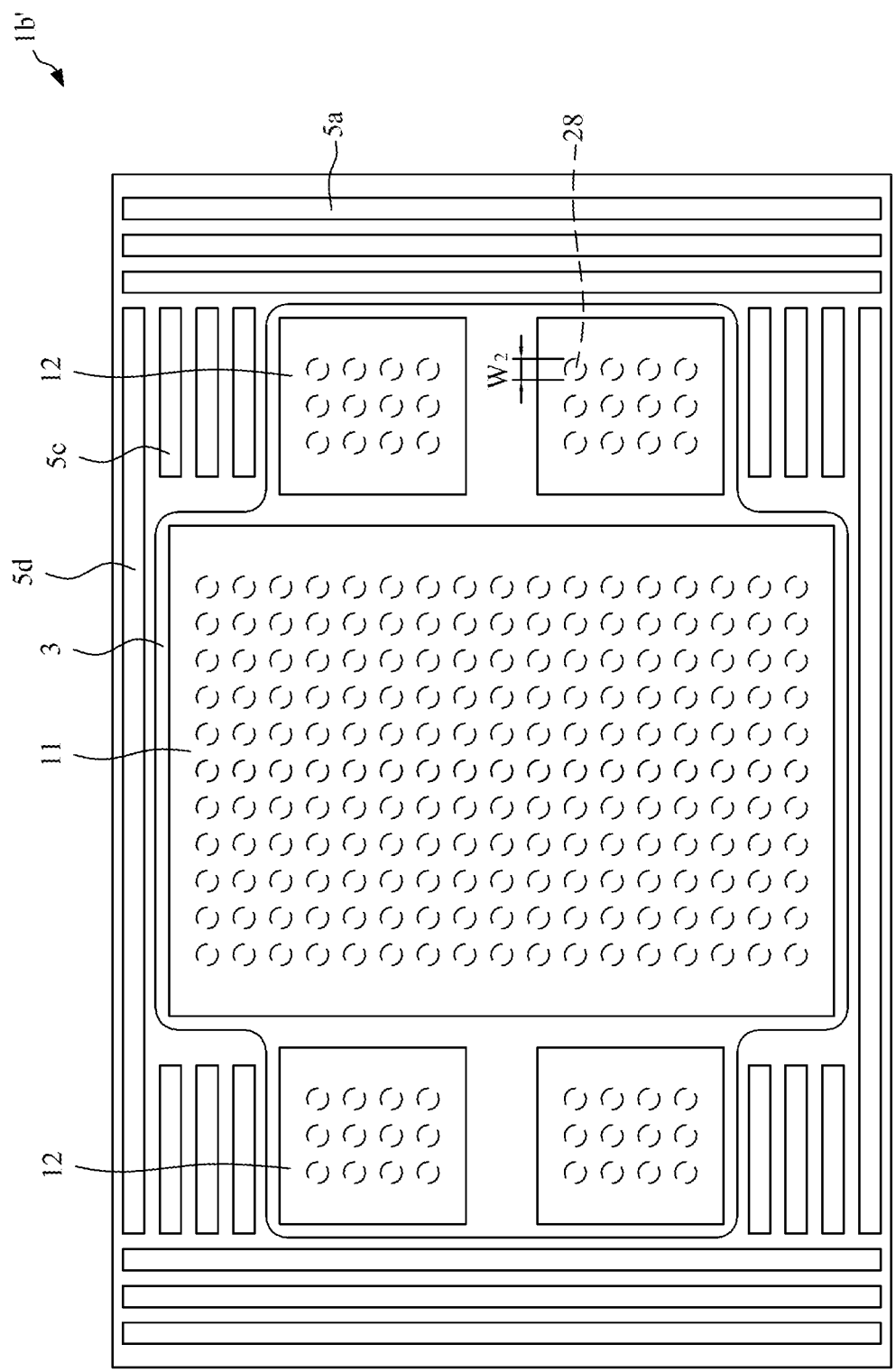
FIG. 6 illustrates a top view of a semiconductor package structure according to some embodiments of the present disclosure, wherein a first encapsulant is omitted for clear explanation.

FIG. 6 illustrates a top view of a semiconductor package structure 1b' according to some embodiments of the present disclosure, wherein a first encapsulant 4 is omitted for clear explanation. The arrangement or distribution of the first pile structures 5 (or the anchoring structures 5') of the semiconductor package structure 1b' of FIG. 6 is similar to the arrangement or distribution of the first pile structures 5 (or the anchoring structures 5') of the semiconductor package structure 1b of FIG. 5, except that the first pile structures 5 (or the anchoring structures 5') may further include a plurality of second segments 5c and a plurality of third segments 5d. Thus, in FIG. 6, all of the first pile structures 5 (including the first segments 5a, the second segments 5c and the third segments 5d) are in strip types from the top view.

Figure 7:
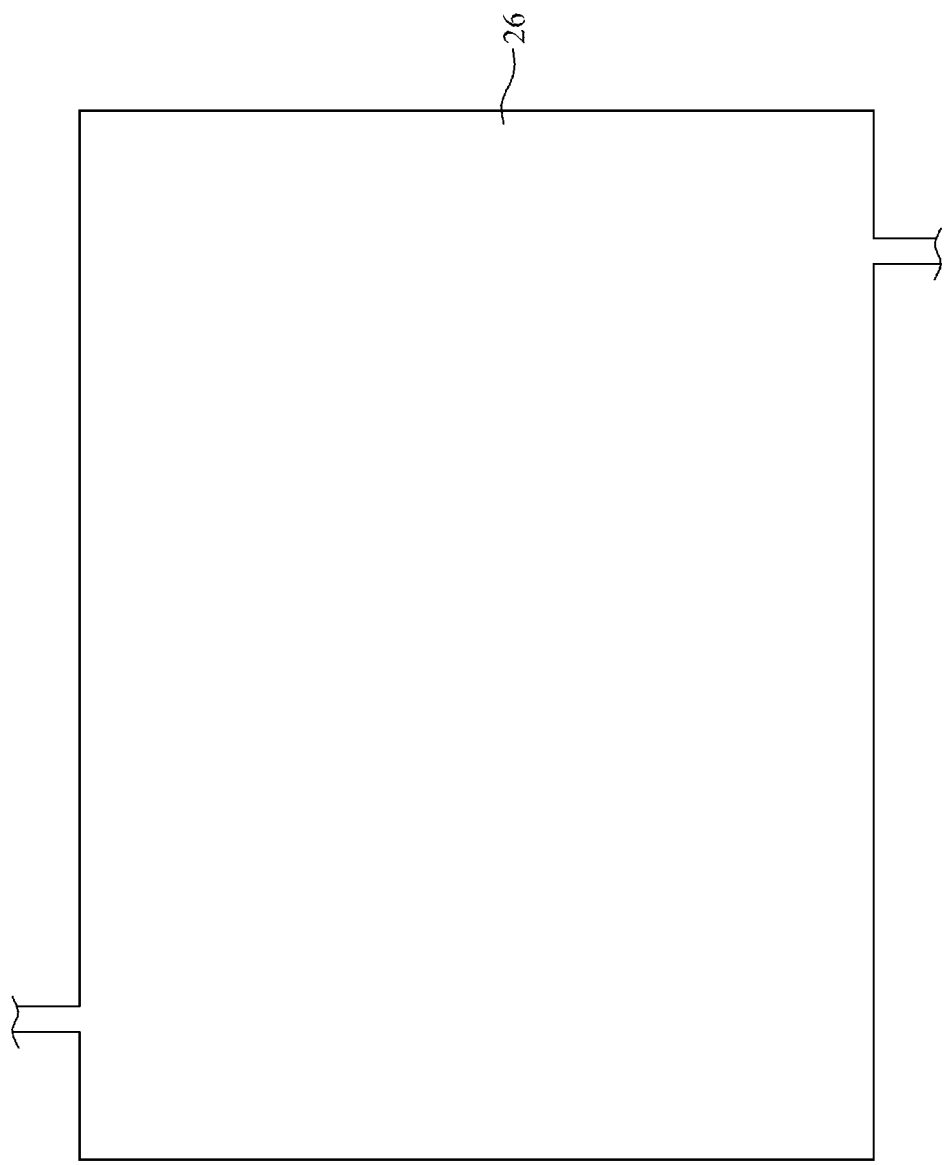
FIG. 7 illustrates a top view of a base portion according to some embodiments of the present disclosure.

FIG. 7 illustrates a top view of a base portion 26 according to some embodiments of the present disclosure. The base portion 26 may be in a solid rectangular shape.

Figure 8:
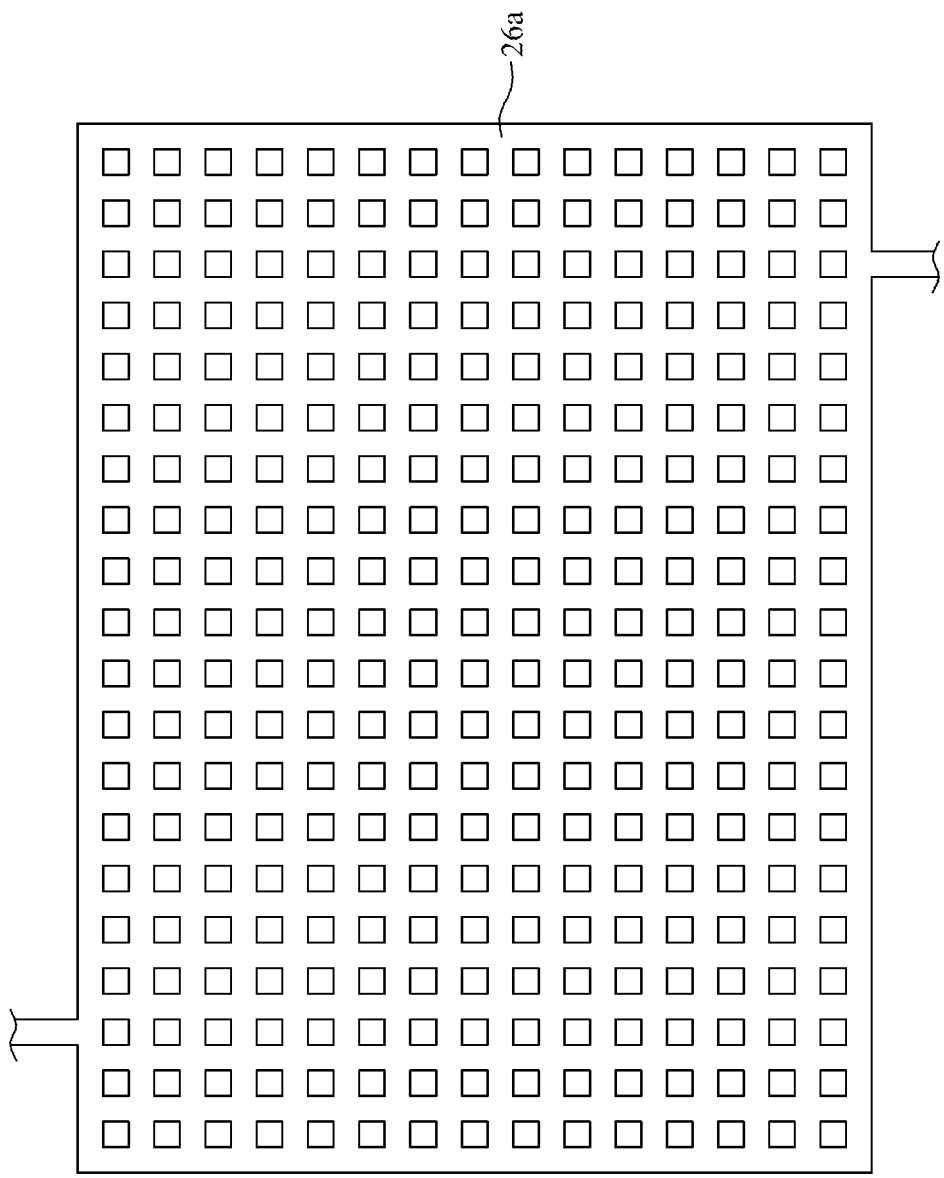
FIG. 8 illustrates a top view of a base portion according to some embodiments of the present disclosure.

FIG. 8 illustrates a top view of a base portion 26a according to some embodiments of the present disclosure. The base portion 26a may be in a net or grid form.

Figure 9:
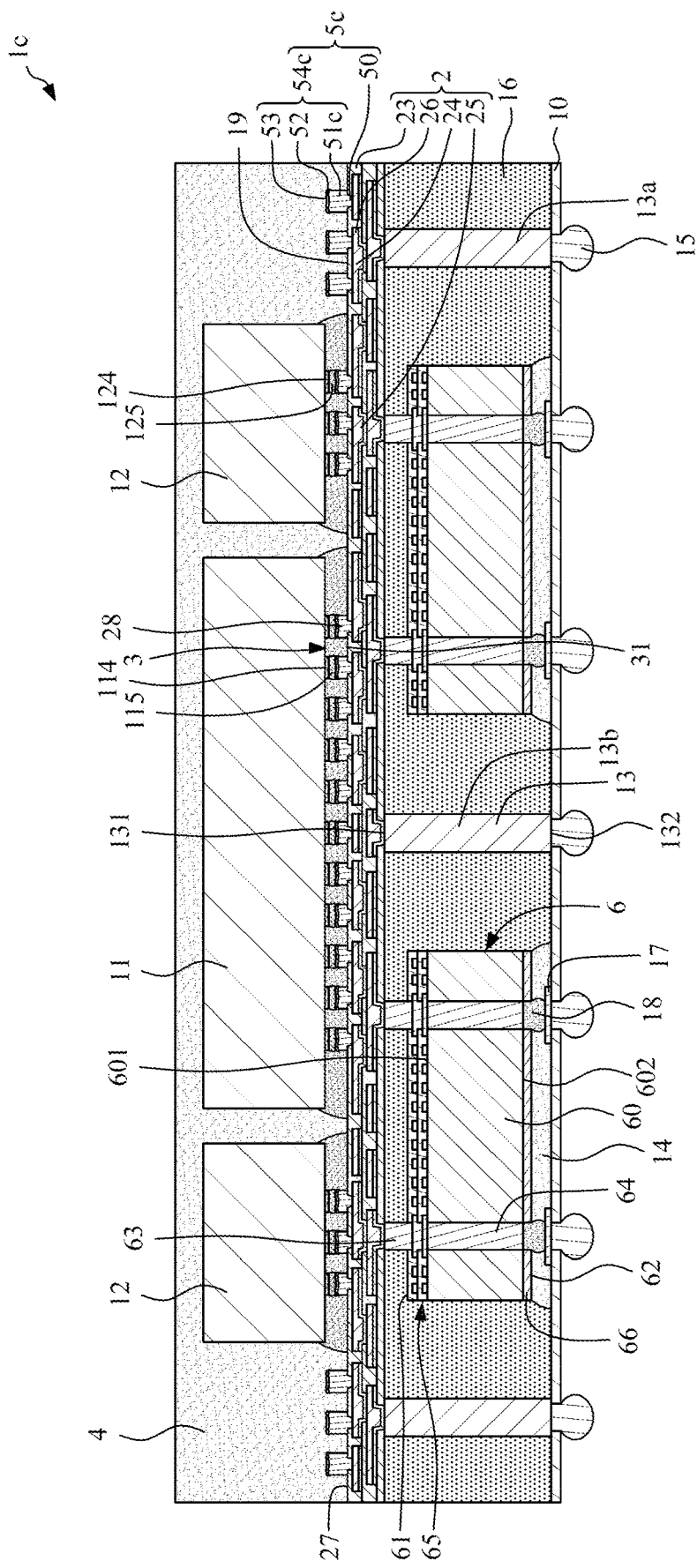
FIG. 9 illustrates a cross-sectional view of a semiconductor package structure according to some embodiments of the present disclosure.

FIG. 9 illustrates a cross-sectional view of a semiconductor package structure 1c according to some embodiments of the present disclosure. The semiconductor package structure 1c of FIG. 9 is similar to the semiconductor package structure 1b of FIG. 4, except for a structure of the first pile structures 5c. A height (or a thickness) of the first portion 51c of the protrusion 54c of the first pile structures 5c of FIG. 9 is greater than a height (or a thickness) of the first portion 51 of the protrusion 54 of the first pile structures 5 of FIG. 4. Thus, in FIG. 9, the size and structure of the conductive pad 28 may be different from the size and structure of the first pile structure 5c.

Figure 10:
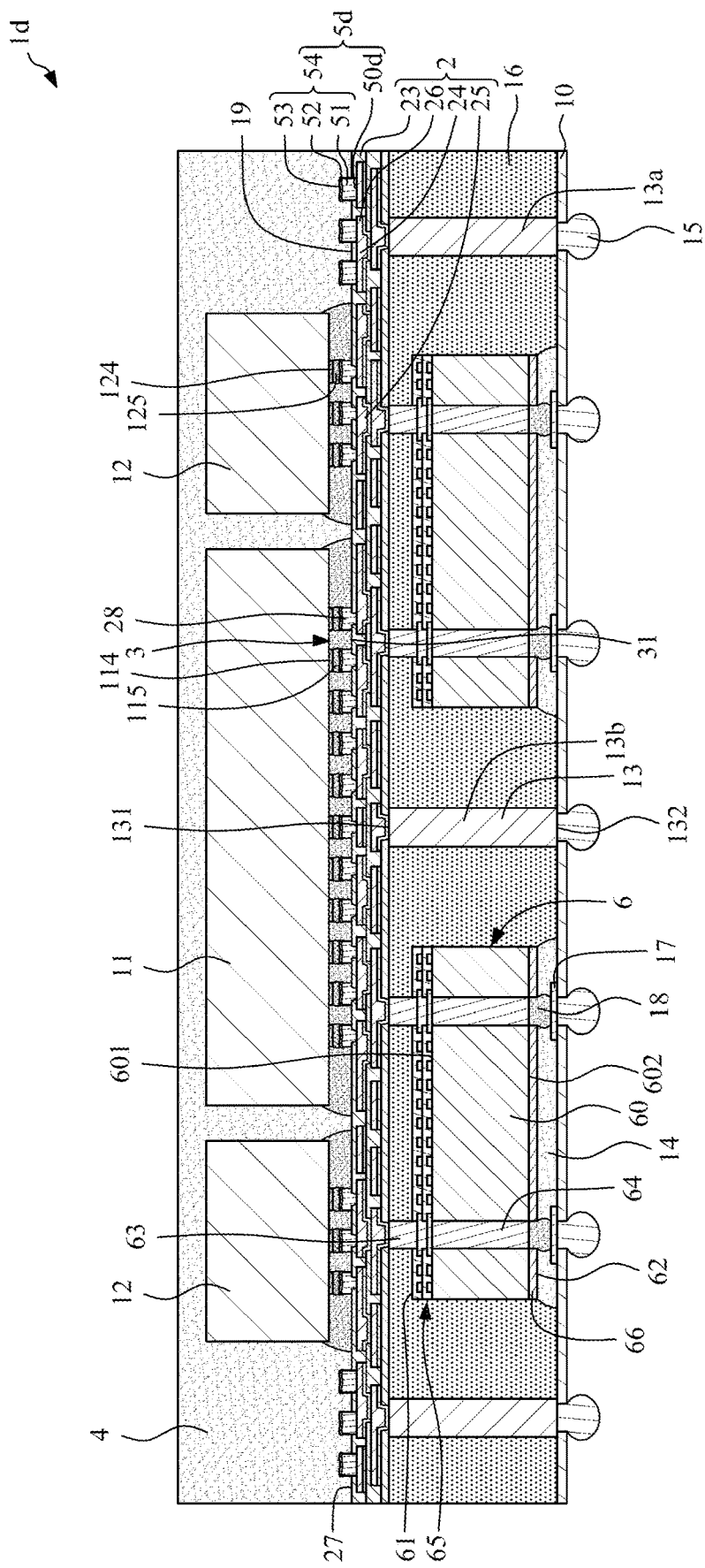
FIG. 10 illustrates a cross-sectional view of a semiconductor package structure according to some embodiments of the present disclosure.

FIG. 10 illustrates a cross-sectional view of a semiconductor package structure 1d according to some embodiments of the present disclosure. The semiconductor package structure 1d of FIG. 10 is similar to the semiconductor package structure 1b of FIG. 4, except for a structure of the first pile structure 5d. As shown in FIG. 10, a width of the entire via portion 50d is substantially equal to a width of the first portion 51. Thus, the entire via portion 50d has a consistent size and width, and does not taper.

Figure 11:
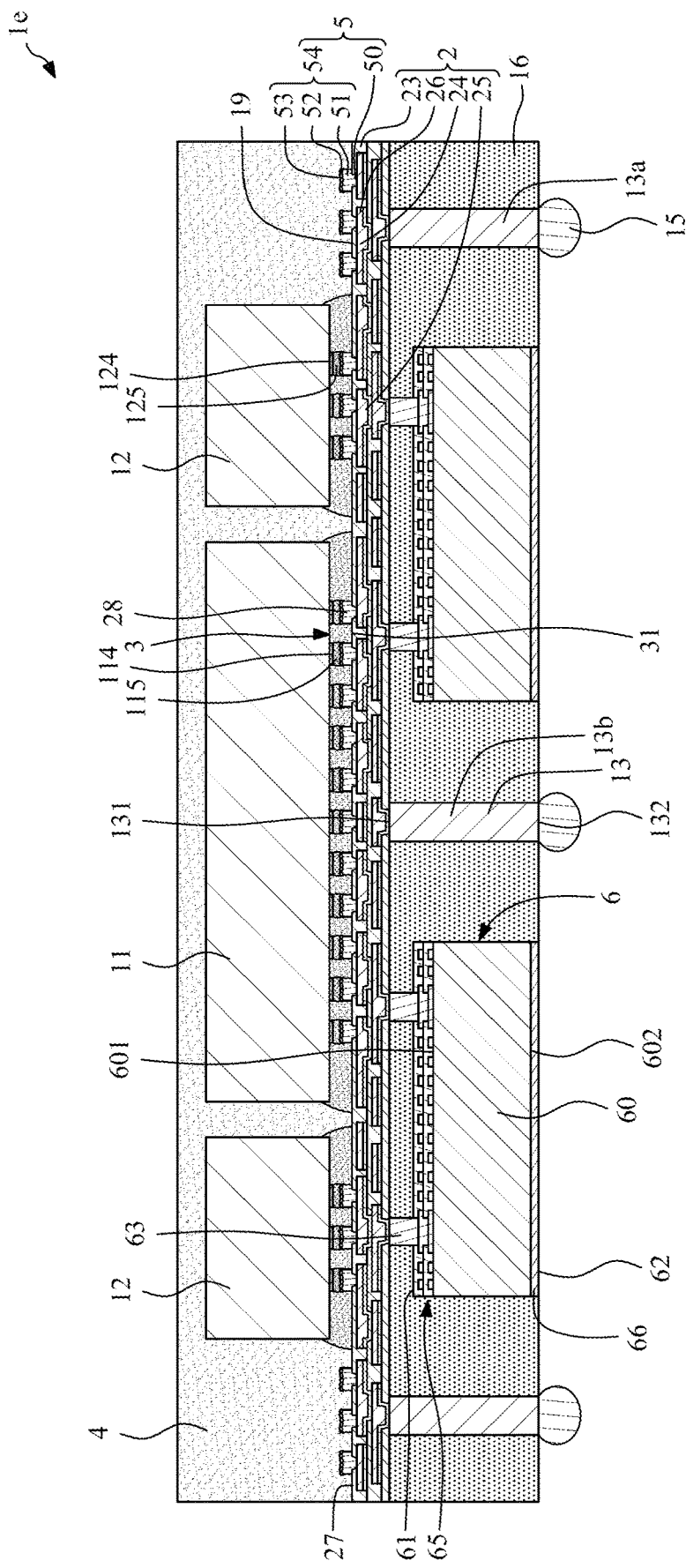
FIG. 11 illustrates a cross-sectional view of a semiconductor package structure according to some embodiments of the present disclosure.

FIG. 11 illustrates a cross-sectional view of a semiconductor package structure 1e according to some embodiments of the present disclosure. The semiconductor package structure 1e of FIG. 11 is similar to the semiconductor package structure 1b of FIG. 4, except that the base dielectric layer 10, solder material 18, the conductive pad 17 and the underfill 14 may be omitted. Thus, the bottom surface of the second encapsulant 16 may be coplanar with the bottom surface of the insulation layer 66.

Figure 12:
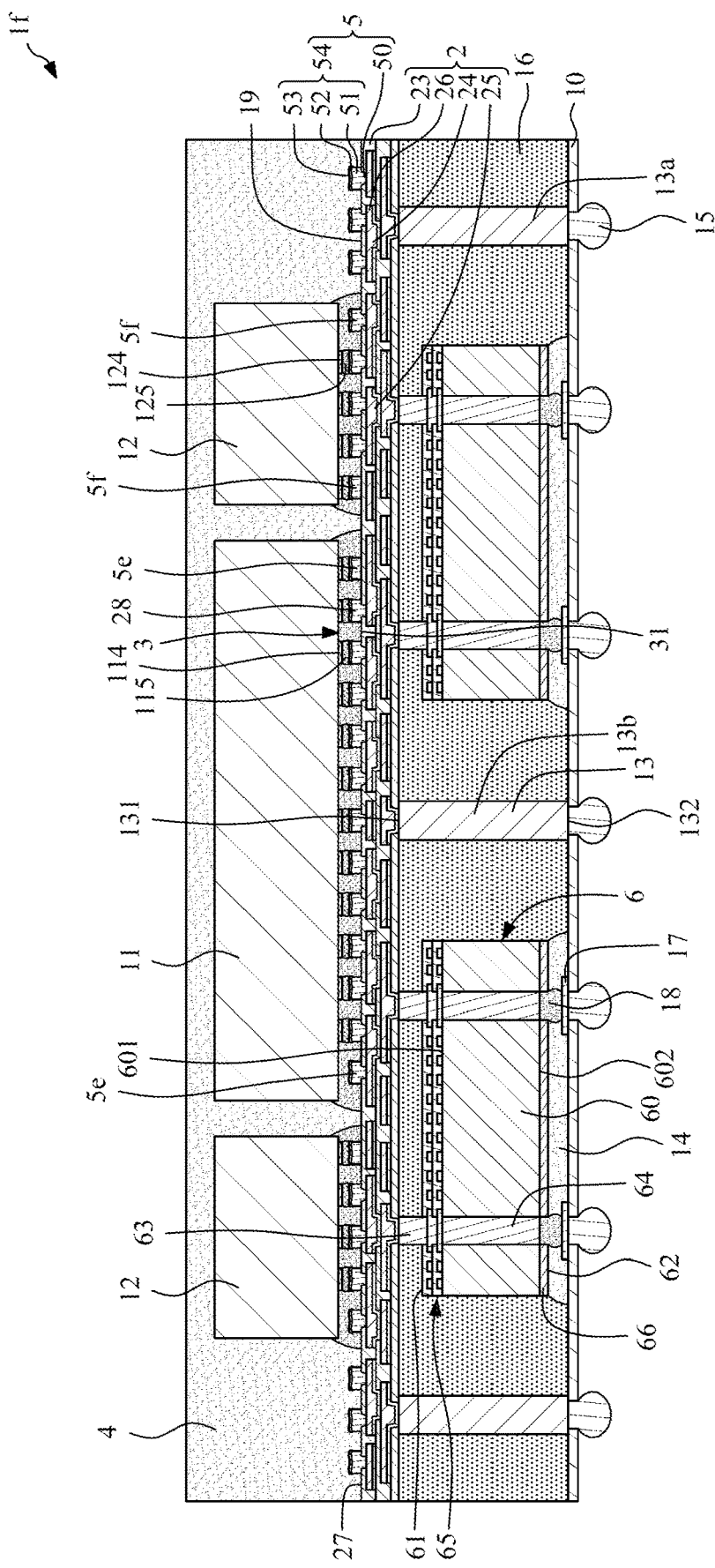
FIG. 12 illustrates a cross-sectional view of a semiconductor package structure according to some embodiments of the present disclosure.

FIG. 12 illustrates a cross-sectional view of a semiconductor package structure if according to some embodiments of the present disclosure. The semiconductor package structure if of FIG. 12 is similar to the semiconductor package structure 1b of FIG. 4, except that second pile structures 5e, 5f are further included. The second pile structures 5e, 5f may be disposed under the electronic components 11, 12. Further, the second pile structures 5e, 5f may extend through the second interface 31 so as to be disposed in the underfill 3 and the circuit pattern structure 2. Some of the second pile structures 5e, 5f may connect to the electrical contacts 114, 124 through the solder materials 115, 125, and some may not. The second pile structures 5e, 5f may be dummy.

Figure 13:
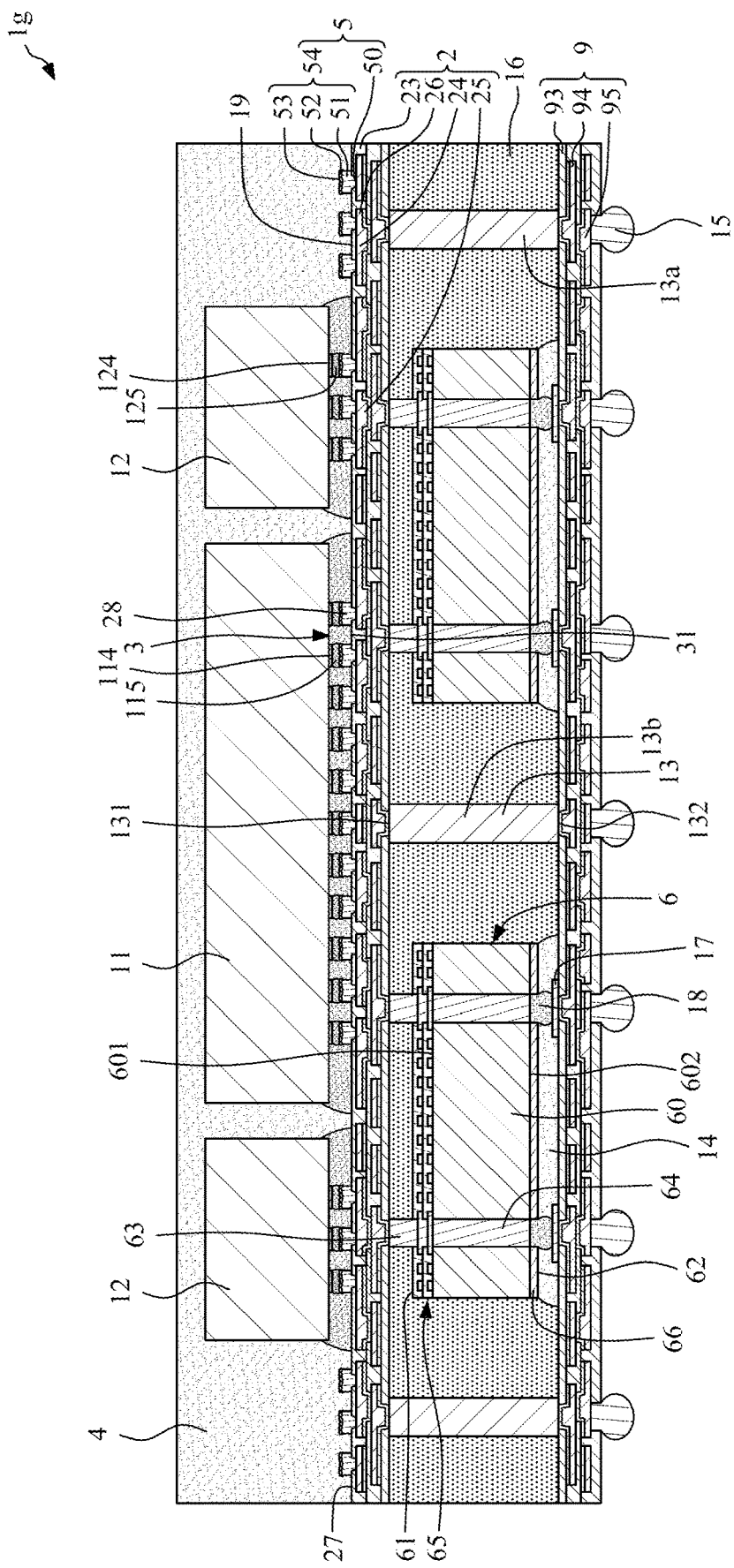
FIG. 13 illustrates a cross-sectional view of a semiconductor package structure according to some embodiments of the present disclosure.

FIG. 13 illustrates a cross-sectional view of a semiconductor package structure 1g according to some embodiments of the present disclosure. The semiconductor package structure 1g of FIG. 13 is similar to the semiconductor package structure 1b of FIG. 4, except that the base dielectric layer 10 may be replaced by a lower circuit pattern structure 9. The lower circuit pattern structure 9 may be a redistribution structure, and may be disposed on the bottom surface of the second encapsulant 16. The lower circuit pattern structure 9 may include at least one dielectric layer 93, at least one circuit layer 94 (or a redistribution layer) and at least one inner via 95. As shown in FIG. 13, the lower circuit pattern structure 9 may include three dielectric layers 93, two circuit layers 94 and a plurality of inner vias 95. However, the amount of the dielectric layers 93 and the amount of the circuit layers 94 are not limited in the present disclosure. The dielectric layer 93 may be made of a cured photoimageable dielectric (PID) material such as epoxy or polyimide (PI) including photoinitiators. The dielectric layers 93 may cover the circuit layers 94, and may be stacked on one another. The inner vias 95 may connect the circuit layers 94. The inner via 95 may taper toward the bridge die 6 and/or the reinforcement pillars 13. Thus, a tapering direction of the inner via 95 of the lower circuit pattern structure 9 may be different from a tapering direction of the inner via 25 of the circuit pattern structure 2.

FIG. 14 through FIG. 20 illustrate a method for manufacturing a semiconductor package structure according to some embodiments of the present disclosure. In some embodiments, the method is for manufacturing the semiconductor package structure 1b shown in FIG. 4.

Figure 14:
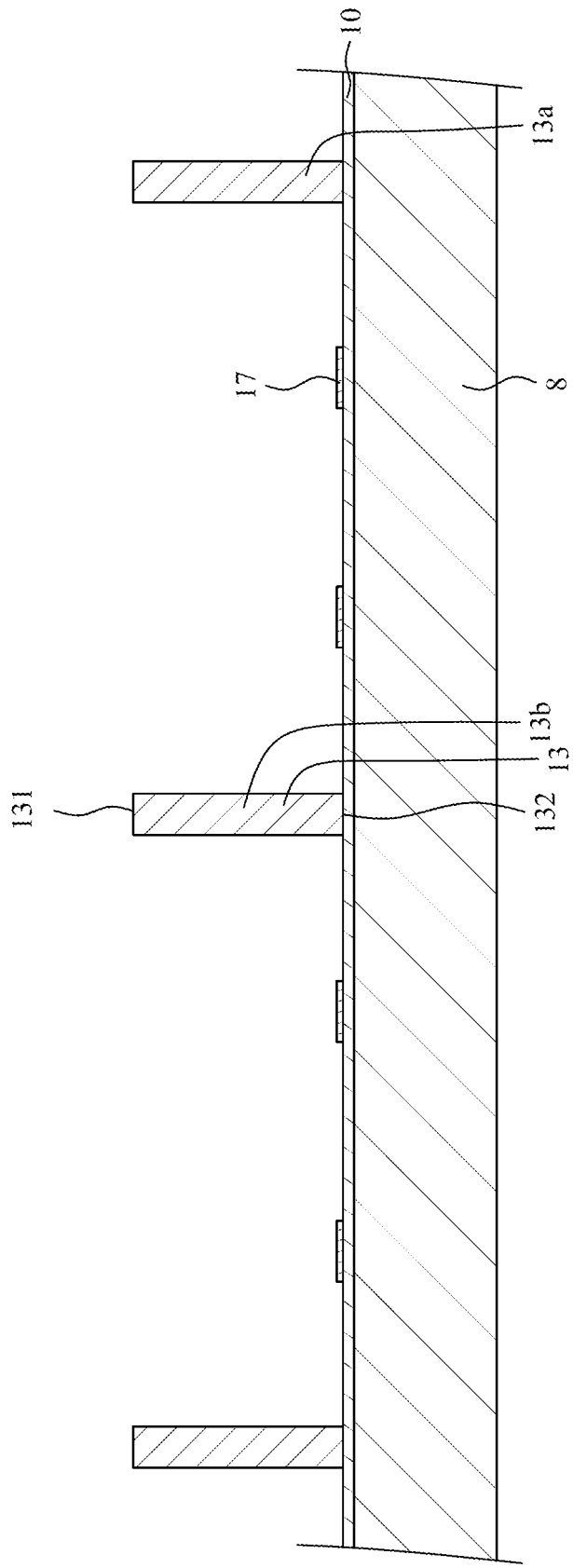
FIG. 14 illustrates one or more stages of an example of a method for manufacturing a semiconductor package structure according to some embodiments of the present disclosure.

Referring to FIG. 14, a carrier 8 is provided. The carrier 8 may be in a wafer type or strip type. Then, a base dielectric layer 10 is formed on the carrier 8. Then, a plurality of reinforcement pillars 13 (including the first reinforcement pillars 13a and the second reinforcement pillars 13b) and a plurality of conductive pads 17 are formed on the base dielectric layer 10.

Figure 15:
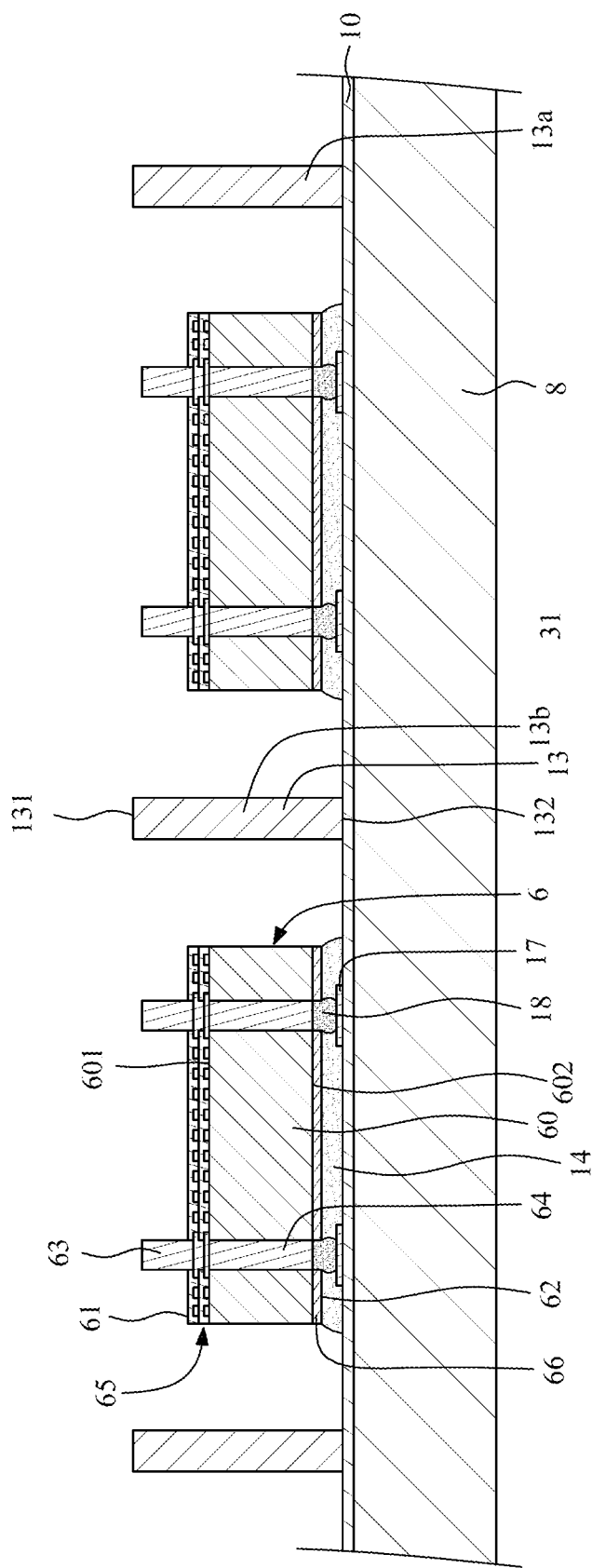
FIG. 15 illustrates one or more stages of an example of a method for manufacturing a semiconductor package structure according to some embodiments of the present disclosure.

Referring to FIG. 15, at least one bridge die 6 are disposed on the carrier 8. The bridge die 6 may be similar to or same as the bridge die 6 of FIG. 4. The bridge die 6 may be electrically connected to the conductive pads 17 through the solder material 18.

Figure 16:
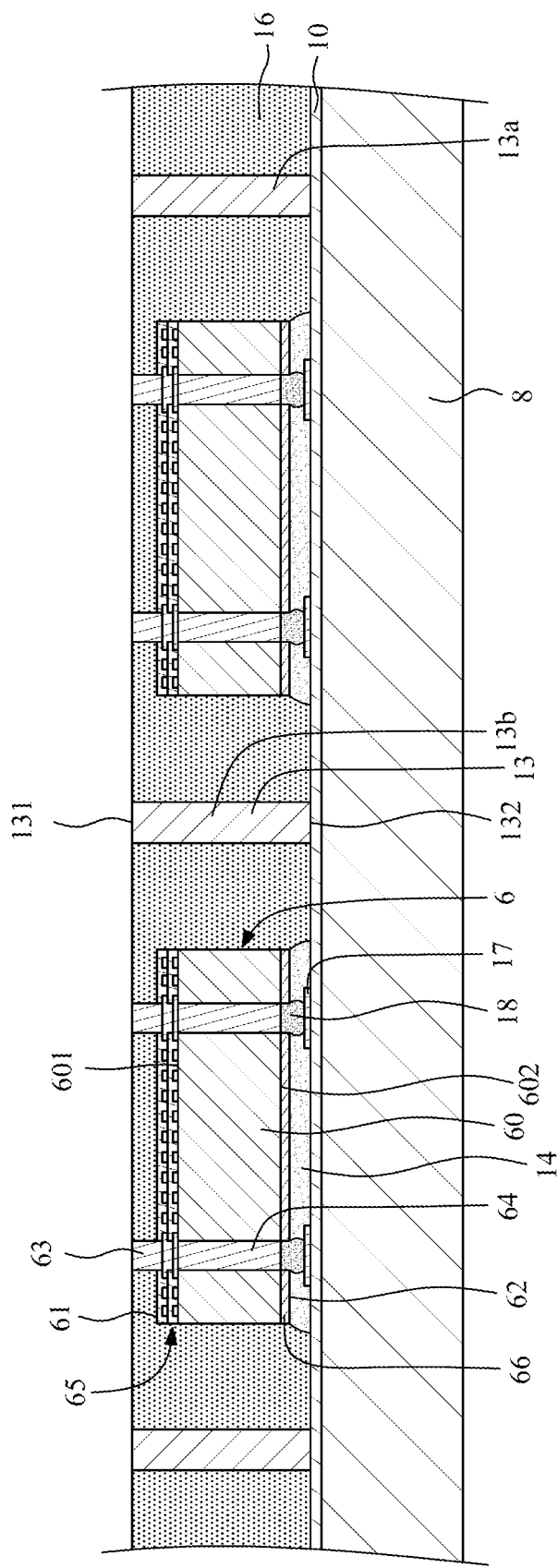
FIG. 16 illustrates one or more stages of an example of a method for manufacturing a semiconductor package structure according to some embodiments of the present disclosure.

Referring to FIG. 16, a second encapsulant 16 is formed on the base dielectric layer 10 to surround or encapsulate the bridge dice 6 and the reinforcement pillars 13. A material of the second encapsulant 16 may be a molding compound with or without fillers. In some embodiments, a grinding process may be conducted on the top surface of the second encapsulant 16. Thus, the top surface of the second encapsulant 16 may be substantially coplanar with or aligned with the first surface 131 of the reinforcement pillar 13 and the top surfaces of the short pillars 63.

Figure 17:
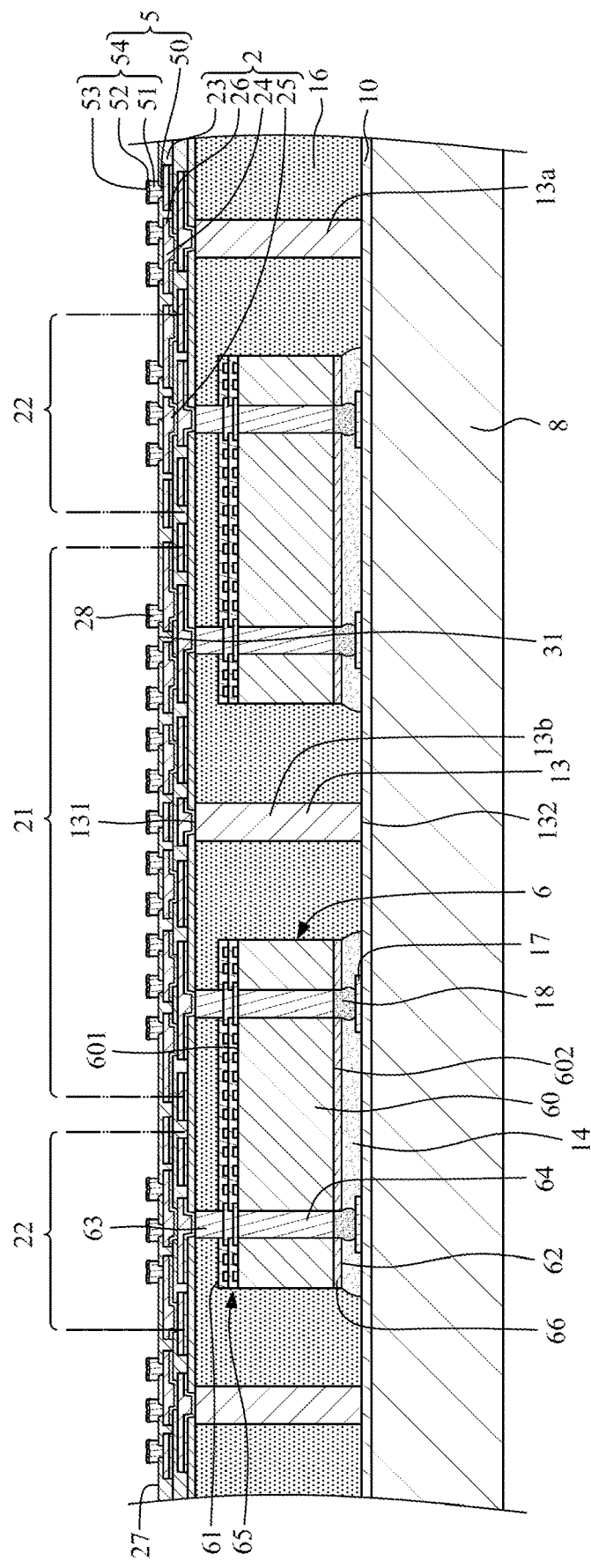
FIG. 17 illustrates one or more stages of an example of a method for manufacturing a semiconductor package structure according to some embodiments of the present disclosure.

Referring to FIG. 17, a circuit pattern structure 2 may be disposed or formed on the top surface of second encapsulant 16. The circuit pattern structure 2 of FIG. 17 may be similar to or same as the circuit pattern structure 2 of FIG. 4. The circuit pattern structure 2 may have at least one bonding area 21, 22. Further, the first pile structures 5 and the conductive pads 28 may be formed concurrently.

Figure 18:
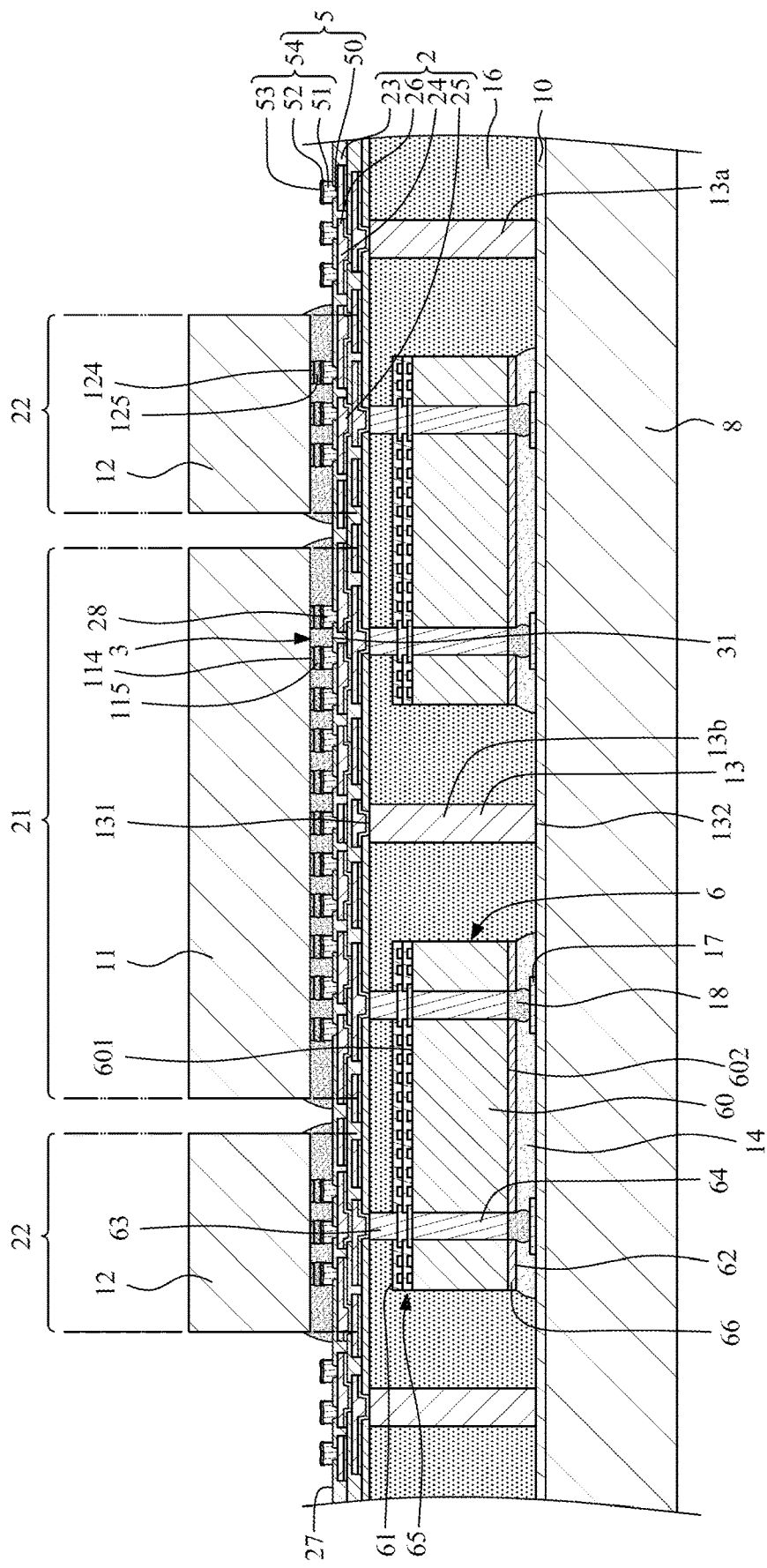
FIG. 18 illustrates one or more stages of an example of a method for manufacturing a semiconductor package structure according to some embodiments of the present disclosure.

Referring to FIG. 18, the electronic components 11, 12 are disposed adjacent to the top surface 27 of the circuit pattern structure 2 side by side, and are electrically connected to the circuit layer 24 of the circuit pattern structure 2. The electronic components 11, 12 may be disposed above or disposed over the bonding areas 21, 22 of the circuit pattern structure 2.

Figure 19:
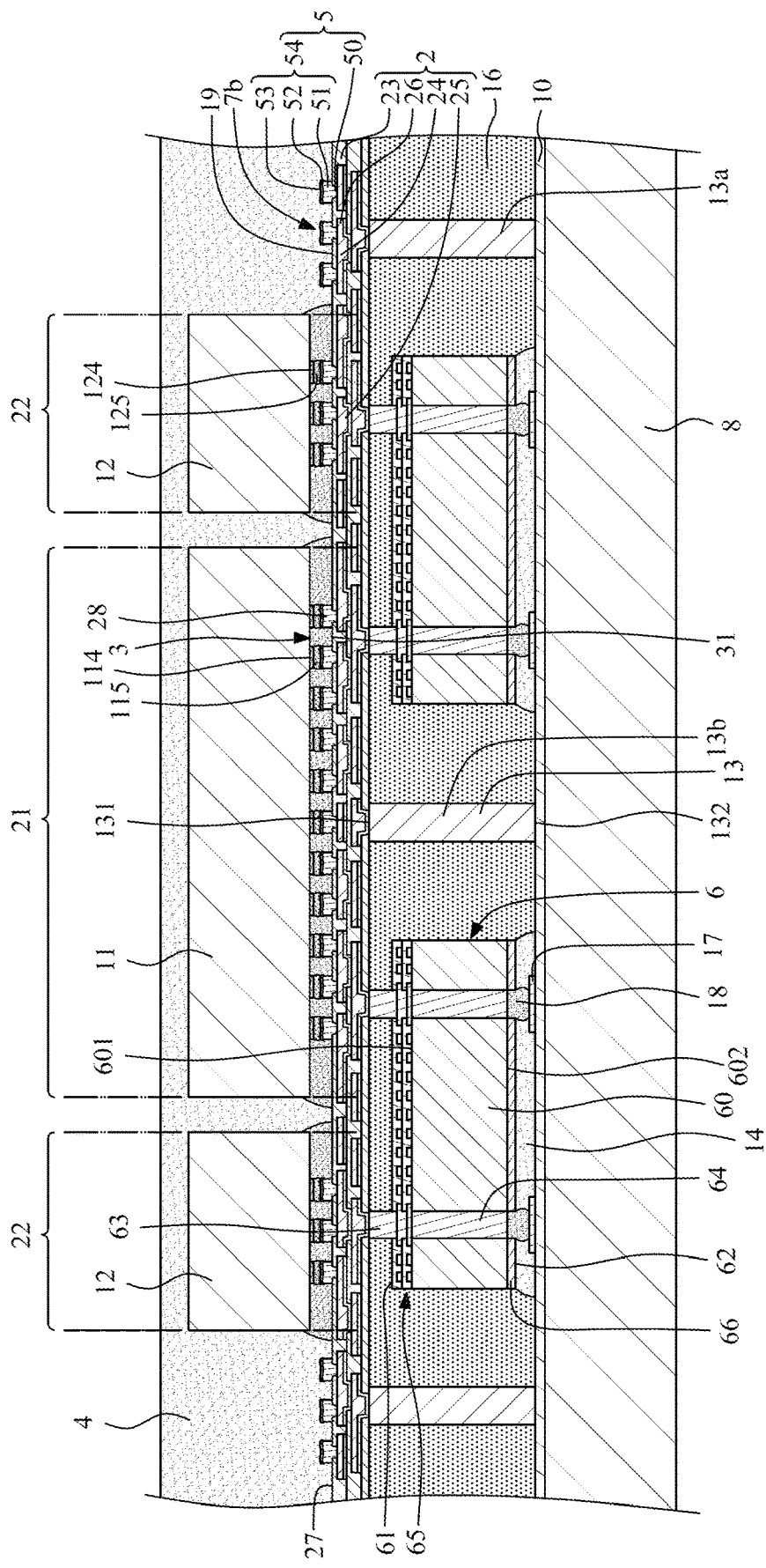
FIG. 19 illustrates one or more stages of an example of a method for manufacturing a semiconductor package structure according to some embodiments of the present disclosure.

Referring to FIG. 19, a first encapsulant 4 may be formed or disposed on the circuit pattern structure 2 and may encapsulate the electronic components 11, 12 and the underfill 3. A material of the first encapsulant 4 may be a molding compound with or without fillers. If the underfill 3 is omitted, the first encapsulant 4 may be disposed in the space between the electronic components 11, 12 and the circuit pattern structure 2.

Figure 20:
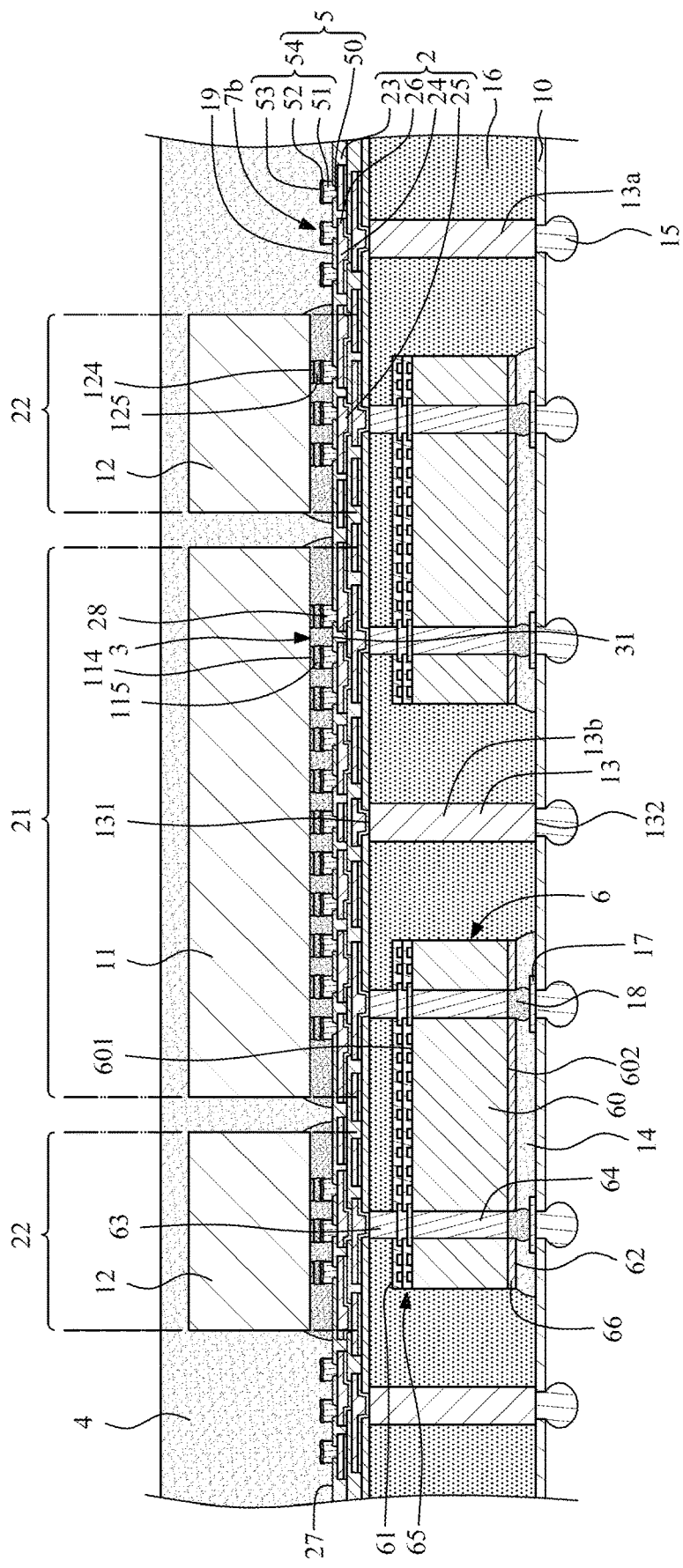
FIG. 20 illustrates one or more stages of an example of a method for manufacturing a semiconductor package structure according to some embodiments of the present disclosure.

Referring to FIG. 20, the carrier 8 is removed. Then, a plurality of openings are formed to extend through the base dielectric layer 10 to expose the conductive pads 17 and the reinforcement pillars 13. Then, a plurality of external connectors 15 (e.g., solder material) may be formed or disposed in the openings of the base dielectric layer 10 to contact the conductive pads 17 and the reinforcement pillars 13.

Then, a singulation process is conducted to obtain a plurality of semiconductor package structures 1b of FIG. 4.

Spatial descriptions, such as "above," "below," "up," "left," "right," "down," "top," "bottom," "vertical," "horizontal," "side," "higher," "lower," "upper," "over," "under," and so forth, are indicated with respect to the orientation shown in the figures unless otherwise specified. It should be understood that the spatial descriptions used herein are for purposes of illustration only, and that practical implementations of the structures described herein can be spatially arranged in any orientation or manner, provided that the merits of embodiments of this disclosure are not deviated from by such an arrangement.

As used herein, the terms "approximately," "substantially," "substantial" and "about" are used to describe and account for small variations. When used in conjunction with an event or circumstance, the terms can refer to instances in which the event or circumstance occurs precisely as well as instances in which the event or circumstance occurs to a close approximation. For example, when used in conjunction with a numerical value, the terms can refer to a range of variation of less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, a first numerical value can be deemed to be "substantially" the same or equal to a second numerical value if the first numerical value is within a range of variation of less than or equal to ±10% of the second numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%.

Two surfaces can be deemed to be coplanar or substantially coplanar if a displacement between the two surfaces is no greater than 5 μm, no greater than 2 μm, no greater than 1 μm, or no greater than 0.5 μm. A surface can be deemed to be substantially flat if a displacement between a highest point and a lowest point of the surface is no greater than 5 μm, no greater than 2 μm, no greater than 1 μm, or no greater than 0.5 μm.

As used herein, the singular terms "a," "an," and "the" may include plural referents unless the context clearly dictates otherwise.

As used herein, the terms "conductive," "electrically conductive" and "electrical conductivity" refer to an ability to transport an electric current. Electrically conductive materials typically indicate those materials that exhibit little or no opposition to the flow of an electric current. One measure of electrical conductivity is Siemens per meter (S/m). Typically, an electrically conductive material is one having a conductivity greater than approximately $10^4$ S/m, such as at least $10^5$ S/m or at least $10^6$ S/m. The electrical conductivity of a material can sometimes vary with temperature. Unless otherwise specified, the electrical conductivity of a material is measured at room temperature.

Additionally, amounts, ratios, and other numerical values are sometimes presented herein in a range format. It is to be understood that such range format is used for convenience and brevity and should be understood flexibly to include numerical values explicitly specified as limits of a range, but also to include all individual numerical values or sub-ranges encompassed within that range as if each numerical value and sub-range is explicitly specified.

While the present disclosure has been described and illustrated with reference to specific embodiments thereof, these descriptions and illustrations are not limiting. It should be understood by those skilled in the art that various changes may be made and equivalents may be substituted without departing from the true spirit and scope of the present disclosure as defined by the appended claims. The illustrations may not be necessarily drawn to scale. There may be distinctions between the artistic renditions in the present disclosure and the actual apparatus due to manufacturing processes and tolerances. There may be other embodiments of the present disclosure which are not specifically illustrated. The specification and drawings are to be regarded as illustrative rather than restrictive. Modifications may be made to adapt a particular situation, material, composition of matter, method, or process to the objective, spirit and scope of the present disclosure. All such modifications are intended to be within the scope of the claims appended hereto. While the methods disclosed herein have been described with reference to particular operations performed in a particular order, it will be understood that these operations may be combined, sub-divided, or re-ordered to form an equivalent method without departing from the teachings of the present disclosure. Accordingly, unless specifically indicated herein, the order and grouping of the operations are not limitations of the present disclosure.

What is claimed is:

1. A semiconductor package structure, comprising:
a circuit pattern structure;
an encapsulant disposed on the circuit pattern structure; and
an interlocking structure disposed between the encapsulant and the circuit pattern structure, and being configured to reduce a delamination between the encapsulant and the circuit pattern structure in an environment of temperature variation, wherein the interlocking structure includes a clamping portion around a protrusion protruding from a surface of the circuit pattern structure.

2. The semiconductor package structure of claim 1, wherein the clamping portion contacts a step structure on a lateral surface of the protrusion.

3. The semiconductor package structure of claim 1, wherein the protrusion includes a first portion and a second portion, the first portion is closer to the circuit pattern structure than the second portion is, a width of the first portion is less than a width of the second portion, and the clamping portion contacts the first portion and the second portion.

* * * * *